(12) United States Patent
Wang et al.

(10) Patent No.: US 12,170,059 B2
(45) Date of Patent: Dec. 17, 2024

(54) DISPLAY SUBSTRATE, PREPARATION METHOD THEREOF, AND DISPLAY APPARATUS WITH OPTIMIZED FAN-OUT

(71) Applicants: Chengdu BOE Optoelectronics Technology Co., Ltd., Sichuan (CN); BOE Technology Group Co., Ltd., Beijing (CN)

(72) Inventors: Shilong Wang, Beijing (CN); Haigang Qing, Beijing (CN); Ziyang Yu, Beijing (CN); Yunsheng Xiao, Beijing (CN); Gukhwan Song, Beijing (CN); Zhiliang Jiang, Beijing (CN); Ming Hu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/781,720

(22) PCT Filed: Jul. 19, 2021

(86) PCT No.: PCT/CN2021/106995
§ 371 (c)(1),
(2) Date: Jun. 2, 2022

(87) PCT Pub. No.: WO2023/000125
PCT Pub. Date: Jan. 26, 2023

(65) Prior Publication Data
US 2024/0212597 A1   Jun. 27, 2024

(51) Int. Cl.
*G09G 3/3233*    (2016.01)
*H10K 59/121*   (2023.01)
*H10K 59/131*   (2023.01)

(52) U.S. Cl.
CPC ....... *G09G 3/3233* (2013.01); *H10K 59/1213* (2023.02); *H10K 59/1315* (2023.02); *G09G 2310/08* (2013.01); *G09G 2320/0233* (2013.01)

(58) Field of Classification Search
CPC .................................................... G09G 3/3233
See application file for complete search history.

(56) References Cited

U.S. PATENT DOCUMENTS

| | | | |
|---|---|---|---|
| 2017/0178571 | A1 | 6/2017 | Kang et al. |
| 2019/0157363 | A1 | 5/2019 | Lee |

(Continued)

FOREIGN PATENT DOCUMENTS

| | | |
|---|---|---|
| CN | 109791745 A | 5/2019 |
| CN | 110854156 A | 2/2020 |

(Continued)

OTHER PUBLICATIONS

Office Action dated Sep. 13, 2022 for Chinese Patent Application No. 202180001917.1 and English Translation.

(Continued)

*Primary Examiner* — Gustavo Polo
(74) *Attorney, Agent, or Firm* — Ling Wu; Stephen Yang; Ling and Yang Intellectual Property

(57) ABSTRACT

A display substrate and a manufacturing method therefor, and a display device are provided in the present disclosure. The display substrate includes a drive circuit layer disposed on a substrate, the drive circuit layer includes a plurality of circuit units, at least one circuit unit of the plurality of circuit units includes a pixel drive circuit, a first power supply line providing a power supply signal to the pixel drive circuit, a data signal line providing a data signal to the pixel drive circuit, and a data fan-out line connected with the data signal line; at least a portion of the first power supply line, the data (Continued)

signal line, and the data fan-out line extends along a second direction and is arranged at intervals along a first direction.

19 Claims, 26 Drawing Sheets

(56) References Cited

U.S. PATENT DOCUMENTS

| | | |
|---|---|---|
| 2019/0278145 A1 | 9/2019 | Tanaka et al. |
| 2020/0058725 A1 | 2/2020 | Ka et al. |
| 2021/0013287 A1 | 1/2021 | Bang et al. |
| 2021/0118958 A1* | 4/2021 | Park .................... H10K 59/805 |
| 2021/0296424 A1 | 9/2021 | Cho et al. |
| 2021/0375215 A1 | 12/2021 | Cho et al. |
| 2022/0037447 A1 | 2/2022 | Cho et al. |
| 2022/0310010 A1 | 9/2022 | Cheng et al. |

FOREIGN PATENT DOCUMENTS

| | | |
|---|---|---|
| CN | 111128080 A | 5/2020 |
| CN | 111446266 A | 7/2020 |
| CN | 112071882 A | 12/2020 |
| CN | 112216721 A | 1/2021 |
| CN | 112310125 A | 2/2021 |
| CN | 112567528 A | 3/2021 |
| CN | 112703606 A | 4/2021 |
| CN | 113745286 A | 12/2021 |
| KR | 10-2015-0064277 A | 6/2015 |

OTHER PUBLICATIONS

Office Action dated Oct. 9, 2022 for Chinese Patent Application No. 202180001917.1 and English Translation.

Weiping Liu, "Full design flow solution for flat panel display", Micro/nano Electronics and Intelligent Manufacturing, vol. 2 No. 2 Jun. 2020.

Ruihuan Ren et al., "The Technology of Narrow Border in Mobile Display".

* cited by examiner

DISPLAY SUBSTRATE, PREPARATION METHOD THEREOF, AND DISPLAY APPARATUS WITH OPTIMIZED FAN-OUT

CROSS-REFERENCE TO RELATED APPLICATION

The present application is a U.S. National Phase Entry of International Application No. PCT/CN2021/106995 having an international filing date of Jul. 19, 2021. The above-identified application is hereby incorporated by reference.

TECHNICAL FIELD

The present disclosure relates to, but is not limited to, the field of display technologies, and particularly to a display substrate, a preparation method for the display substrate, and a display apparatus.

BACKGROUND

An Organic Light Emitting Diode (OLED for short) and a Quantum dot Light Emitting Diode (QLED for short) are active light emitting display devices and have advantages of self-luminescence, a wide viewing angle, a high contrast ratio, low power consumption, an extremely high response speed, lightness and thinness, flexibility, and a low cost, etc. With the constant development of a display technology, a flexible display that uses an OLED or a QLED as a light emitting device and performs signal control by a Thin Film Transistor (TFT for short) has become a mainstream product in the field of display at present.

SUMMARY

The following is a summary about subject matters described in the present disclosure in detail. The summary is not intended to limit a scope of protection of claims.

In one aspect, the present disclosure provides a display substrate including a drive circuit layer disposed on a substrate, wherein the drive circuit layer includes a plurality of circuit units, at least one circuit unit of the plurality of circuit units includes a pixel drive circuit, a first power supply line providing a power supply signal to the pixel drive circuit, a data signal line providing a data signal to the pixel drive circuit, and a data fan-out line connected with the data signal line; at least a portion of the first power supply line, the data signal line, and the data fan-out line extends along a second direction and is arranged at intervals along a first direction, at least a portion of the data fan-out line is disposed between the first power supply line and the data signal line, the first direction intersects with the second direction.

In an exemplary implementation, the data fan-out line is connected with the data signal line through a via.

In an exemplary implementation, an orthographic projection of a portion of the data fan-out line extending along the second direction on the plane of the display substrate is not overlapped with an orthographic projection of the first power supply line on the plane of the display substrate, the orthographic projection of a portion of the data fan-out line extending along the second direction on the plane of the display substrate is not overlapped with an orthographic projection of a body portion of the data signal line on the plane of the display substrate.

In an exemplary implementation, the data fan-out line at least includes a first data fan-out line extending along the second direction, at least a portion of the first data fan-out line is disposed between the first power supply line and the data signal line.

In an exemplary implementation, the at least one circuit unit further includes an initial signal line providing an initial signal to the pixel drive circuit, the initial signal line includes a first initial signal line of which a body portion extends along the first direction and an initial signal connection line of which a body portion extends along the second direction, the initial signal connection line is connected with the first initial signal line; an orthographic projection of at least one data fan-out line on the plane of the display substrate is at least partially overlapped with an orthographic projection of the initial signal connection line on the plane of the display substrate.

In an exemplary implementation, the initial signal connection line is connected with the first initial signal line through a via.

In an exemplary implementation, the data fan-out line at least includes a second data fan-out line extending along the second direction, an orthographic projection of the second data fan-out line on the plane of the display substrate is at least partially overlapped with an orthographic projection of the initial signal connection line on the plane of the display substrate.

In an exemplary implementation, the data fan-out line at least includes a third data fan-out line extending along the first direction, the third data fan-out line is connected with the first data fan-out line or the second data fan-out line.

In an exemplary implementation, the display substrate includes a display region and a bonding region located at a side of the display region, wherein the first power supply line, the data signal line and the data fan-out line are disposed in the display region, and the bonding region at least includes one lead line; a first end of the data fan-out line is connected with the data signal line, and a second end of the data fan-out line is connected with the lead line.

In an exemplary implementation, in a plane perpendicular to the display substrate, the drive circuit layer includes a first conductive layer, a second conductive layer, a third conductive layer and a fourth conductive layer sequentially disposed on the substrate, and insulating layers are disposed between the first conductive layer and the second conductive layer, between the second conductive layer and the third conductive layer, and between the third conductive layer and the fourth conductive layer; the data signal line and the data fan-out line are disposed in different conductive layers.

In an exemplary implementation, the first power supply line and the data signal line are disposed in the third conductive layer, and the data fan-out line is disposed in the fourth conductive layer.

In an exemplary implementation, the drive circuit layer further includes a first initial signal line of which a body portion extends along the first direction and an initial signal connection line of which a body portion extends along the second direction, the first initial signal line and the initial signal connection line are disposed in different conductive layers, and the initial signal connection line is connected with the first initial signal line through a via.

In an exemplary implementation, the first initial signal line is disposed in the second conductive layer, and the initial signal connection line is disposed in the third conductive layer.

In an exemplary implementation, the initial signal connection line is connected with a first region of an active layer of a first transistor in the pixel drive circuit through a via.

In an exemplary implementation, the initial signal connection line includes a first line segment and a second line segment connected with each other, the first line segment is a straight line segment extending along the second direction, the second line segment is a zig-zag line segment, and an orthographic projection of the first line segment on the plane of the display substrate is at least partially overlapped with an orthographic projection of the second data fan-out line on the plane of the display substrate.

In another aspect, the present disclosure further provides a display apparatus, including the aforementioned display substrate.

In yet another aspect, the present disclosure further provides a preparation method for a display substrate. The preparation method includes:

forming a drive circuit layer on a substrate; the drive circuit layer includes a plurality of circuit units, at least one circuit unit of the plurality of circuit units includes a pixel drive circuit, a first power supply line providing a power supply signal to the pixel drive circuit, a data signal line providing a data signal to the pixel drive circuit, and a data fan-out line connected with the data signal line; at least a portion of the first power supply line, the data signal line, and the data fan-out line extends along a second direction and is arranged at intervals along a first direction, at least a portion of the data fan-out line is disposed between the first power supply line and the data signal line, the first direction intersects with the second direction.

Other aspects will become apparent upon reading and understanding the drawings and detailed description.

BRIEF DESCRIPTION OF DRAWINGS

Accompany drawings are used to provide understanding for technical solutions of the present disclosure, and form a portion of the description. They are used to explain the technical solutions of the present disclosure together with embodiments of the present disclosure, and do not form a limitation on the technical solutions of the present disclosure.

FIG. 11b is a schematic planar view of the first conductive layer in FIG. 11a.

FIG. 12b is a schematic planar view of the second conductive layer in FIG. 12a.

FIG. 13b is a schematic planar view of a plurality of vias in FIG. 13a.

FIG. 14b is a schematic planar view of the third conductive layer in FIG. 14a.

FIG. 15b is a schematic planar view of a plurality of vias in FIG. 15a.

FIG. 16b is a schematic planar view of the fourth conductive layer in FIG. 16a.

FIG. 17b is a schematic planar view of a plurality of vias in FIG. 17a.

FIG. 18b is a schematic planar view of the fifth conductive layer in FIG. 18a.

FIG. 19b is a schematic planar view of a plurality of vias in FIG. 19a.

FIG. 20b is a schematic planar view of the anode in FIG. 20a.

Figure 1:
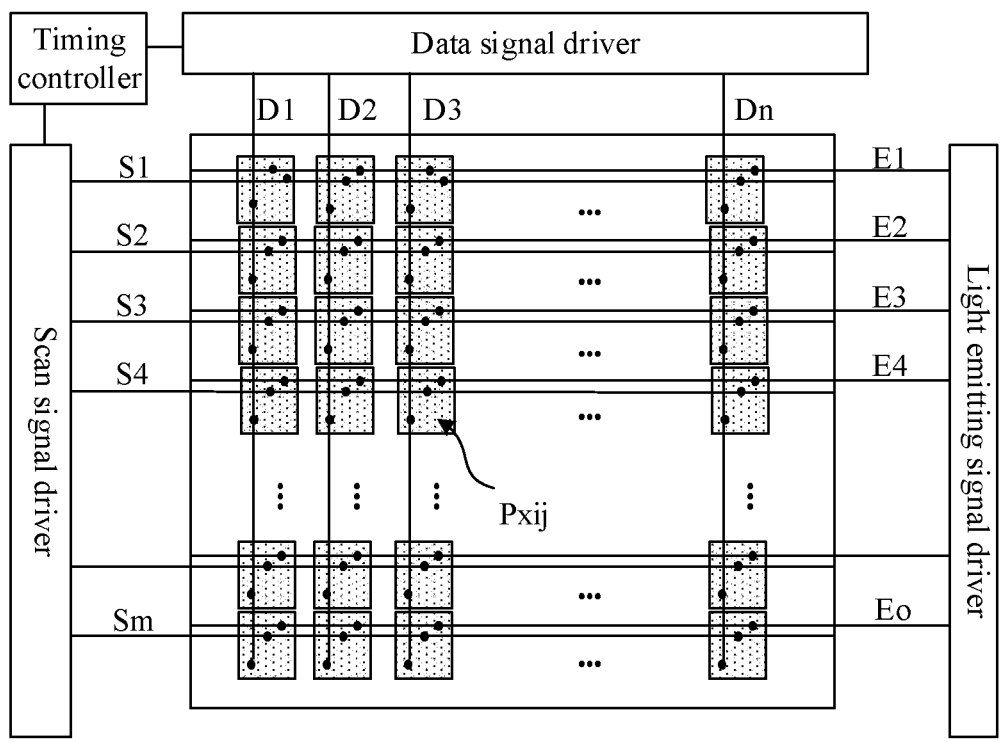
FIG. 1 is a schematic diagram of a structure of a display apparatus.

| Description of reference signs: | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line; | 22-second scan signal line; |

-continued

Description of reference signs:

| | | |
|---|---|---|
| 23- light emitting control line; | 24-first electrode plate; | 31-first initial signal line; |
| 32-second initial signal line; | 33-second electrode plate; | 34-shield electrode; |
| 35-opening; | 41-first power supply line; | 42-data signal line; |
| 43-initial signal connection line; | 44-first connection electrode; | 45-second connection electrode; |
| 46-third connection electrode; | 50-data fan-out line; | 51-first anode connection electrode; |
| 52-first data fan-out line; | 53-second data fan-out line; | 61-second anode connection electrode; |
| 100-display region; | 101-substrate; | 102-drive circuit layer; |
| 103-light emitting structure layer; | 104-encapsulation layer; | 200-bonding region; |
| 201-lead region; | 202-bending region; | 210-transistor; |
| 211-storage capacitor; | 300-bezel region; | 301-anode; |
| 302-pixel define layer; | 303-organic emitting layer; | 304-cathode; |
| 401-first encapsulation layer; | 402-second encapsulation layer; | 403-third encapsulation layer. |

DETAILED DESCRIPTION

In order to make the objects, technical solutions and advantages of the present disclosure more clear, the embodiments of the present disclosure will be described in detail below in combination with the drawings. It is to be noted that implementation modes may be implemented in multiple different forms. Those of ordinary skill in the art can easily understand such a fact that manners and contents may be transformed into various forms without departing from the purpose and scope of the present disclosure. Therefore, the present disclosure should not be construed as being only limited to the contents described in the following implementation modes. The embodiments in the present disclosure and features in the embodiments may be combined randomly with each other if there is no conflict.

The proportion of the drawings in the present disclosure can be used as a reference in the actual process, but is not limited thereto. For example, the width-length ratio of the channel, the thickness and spacing of various film layer, and the width and spacing of various signal line can be adjusted according to the actual needs. The quantity of pixels in the display substrate and the quantity of sub-pixels in each pixel are not limited to the quantity shown in the drawings. The drawings described in the present disclosure are schematic structure diagrams only, and one implementation of the present disclosure is not limited to the shapes, numerical values or the like shown in the drawings.

Ordinal numerals "first", "second", "third", etc., in the specification are set not to form limits in quantity but only to avoid confusion of constituent elements.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The position relationships between the constituent elements change appropriately according to the direction in which the various constituent elements are described. Therefore, appropriate replacements may be made according to situations without being limited to the expressions described in the specification.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct connection, or an indirect connection through middleware, or internal communication between two elements. Those of ordinary skill in the art may understand specific meanings of these terms in the present disclosure according to specific situations.

In the specification, a transistor refers to a component which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region and the source electrode. It is to be noted that, in the specification, the channel region refers to a region that the current mainly flows through.

In the specification, a first electrode may be the drain electrode, and a second electrode may be the source electrode. Or, the first electrode may be the source electrode, and the second electrode may be the drain electrode. In a case that transistors with opposite polarities are used, or a direction of a current changes during work of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with some electrical function" is not particularly limited as long as electrical signals may be sent and received between the connected constituent elements. Examples of the "element with a certain electric action" include not only an electrode and wiring, but also a switching element such as a transistor, a resistor, an inductor, a capacitor, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, sometimes a "conducting layer" may be replaced with a "conducting film". Similarly, sometimes an "insulating film" may be replaced with an "insulating layer".

Triangle, rectangle, trapezoid, pentagon or hexagon in this specification are not strictly defined, but can be approximate triangle, rectangle, trapezoid, pentagon or hexagon, etc. There can be some small deformation caused by tolerance, and there may be a chamfer, arc edge and deformation, etc.

In the present disclosure, "about" refers to that a boundary is defined not so strictly and numerical values in process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected with the data driver, the scan driver and the light emitting driver respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, i and j may be natural numbers, at least one sub-pixel Pxij may include a circuit unit and a light emitting device connected with the circuit unit, and the circuit unit may include at least one scan signal line, at least one data signal line, at least one light emitting signal line and a pixel drive circuit. In an exemplary implementation, the timing controller may provide a gray value and a control signal, which are suitable for the specification of the data driver, to the data driver; provide a clock signal, a scan start signal, etc., which are suitable for the specification of the scan driver, to the scan driver; and provide a clock signal, a transmit stop signal, etc., which are suitable for the specification of the light emitting driver, to the light emitting driver. The data signal driver may generate a data voltage to be provided to the data signal lines D1, D2, D3, . . . , and Dn using the gray-scale value and the control signal that are received from the timing controller. For example, the data driver may sample the gray value using the clock signal and apply a data voltage corresponding to the gray value to the data signal lines D1 to Dn by taking a pixel row as a unit, wherein n may be a natural number. The scan driver may receive the clock signal, the scan starting signal, etc., from the timing controller to generate a scan signal to be provided to the scan signal lines S1, S2, S3, . . . , and Sm. For example, the scan driver may provide sequentially a scan signal with a turn-on level pulse to the scan signal lines S1 to Sm. For example, the scan driver may be constructed in a form of a shift register and may generate a scan signal in such a manner as to transmit sequentially the scan start signal provided in a form of a turn-on level pulse to a next-stage circuit under the control of the clock signal, wherein m may be a natural number. The light emitting signal driver may receive the clock signal, the emission stopping signal, etc., from the timing controller to generate an emission signal to be provided to the light emitting signal lines E1, E2, E3, . . . , and Eo. For example, the light emitting driver may provide sequentially a transmit signal with a turn-off level pulse to the light emitting signal lines E1 to Eo. For example, the light emitting driver may be constructed in a form of a shift register and may generate a transmit signal in such a manner as to transmit sequentially the transmit stop signal provided in a form of a turn-off level pulse to a next-stage circuit under the control of the clock signal, wherein o may be a natural number.

Figure 2:
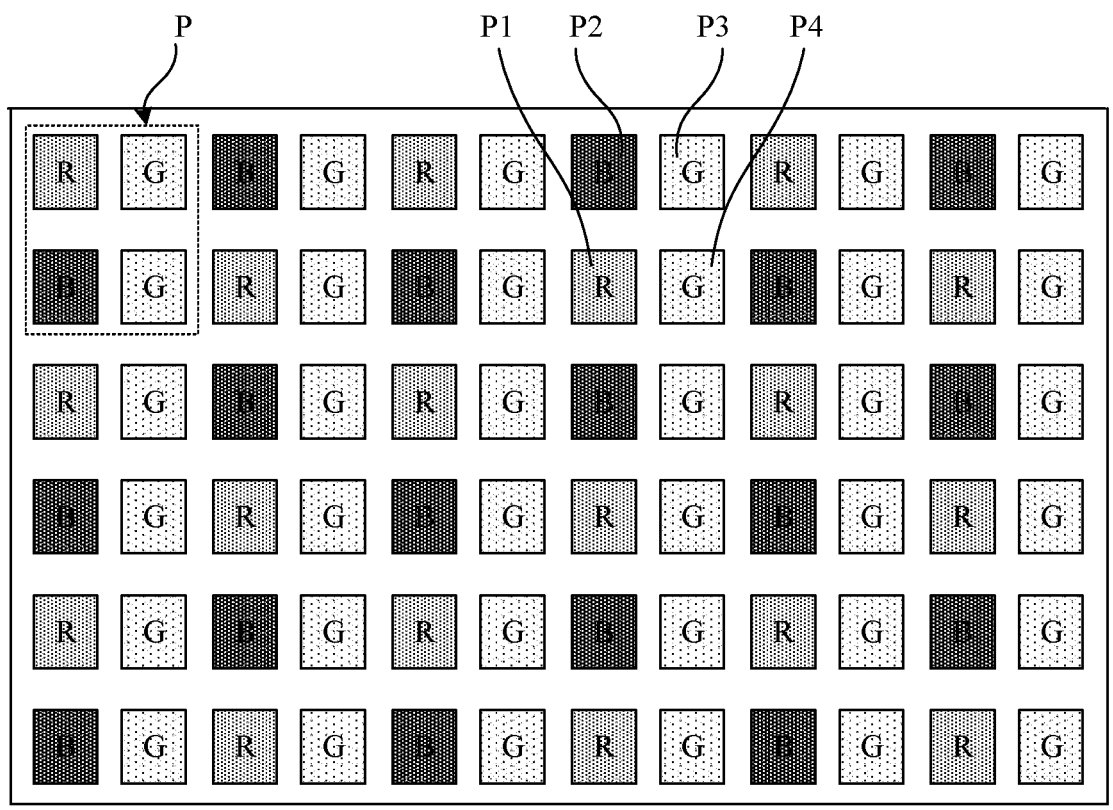
FIG. 2 is a schematic diagram of a planar structure of a display substrate.

FIG. 2 is a schematic diagram of a planar structure of a display substrate. In an exemplary implementation, the display substrate may include a plurality of pixel units P arranged in a matrix manner, at least one pixel unit P may include one first sub-pixel P1 emitting a first color light, one second sub-pixel P2 emitting a second color light, and one third sub-pixel P3 and one fourth sub-pixel P4 emitting a third color light respectively, each of the four sub-pixels may include a circuit unit and a light emitting device, the circuit unit may include a scan signal line, a data signal line and a light emitting signal line and a pixel drive circuit, the pixel drive circuit is respectively connected with the scan signal line, the data signal line, and the light emitting signal line, the pixel drive circuit is configured to receive the data voltage transmitted by the data signal line and output a corresponding current to the light emitting device under the control of the scan signal line and the light emitting signal line. The light emitting device in each sub-pixel is respectively connected with the pixel drive circuit of the sub-pixel where the light emitting device is located, and the light emitting device is configured to emit light with a corresponding luminance in response to a current output by the pixel drive circuit of the sub-pixel where the light emitting device is located.

In an exemplary implementation, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary implementation, a shape of the sub-pixel may be a rectangle, a rhombus, a pentagon, or a hexagon. In one exemplary implementation, four sub-pixels may be arranged in a Square manner to form a GGRB pixel arrangement. In other exemplary embodiments, the four sub-pixels may be arranged side by side horizontally, side by side vertically, or diamond-shaped manner, which is not limited in the present disclosure. In another exemplary implementation, the pixel unit may include three sub-pixels, wherein the three sub-pixels may be arranged side by side horizontally, side by side vertically, or in a form of delta, which is not limited in the present disclosure.

In an exemplary implementation, a plurality of sub-pixels sequentially arranged in the horizontal direction are referred to as a pixel row, and a plurality of sub-pixels sequentially arranged in the vertical direction are referred to as a pixel column, and a plurality of pixel rows and a plurality of pixel columns form a pixel array arranged in an array.

Figure 3:
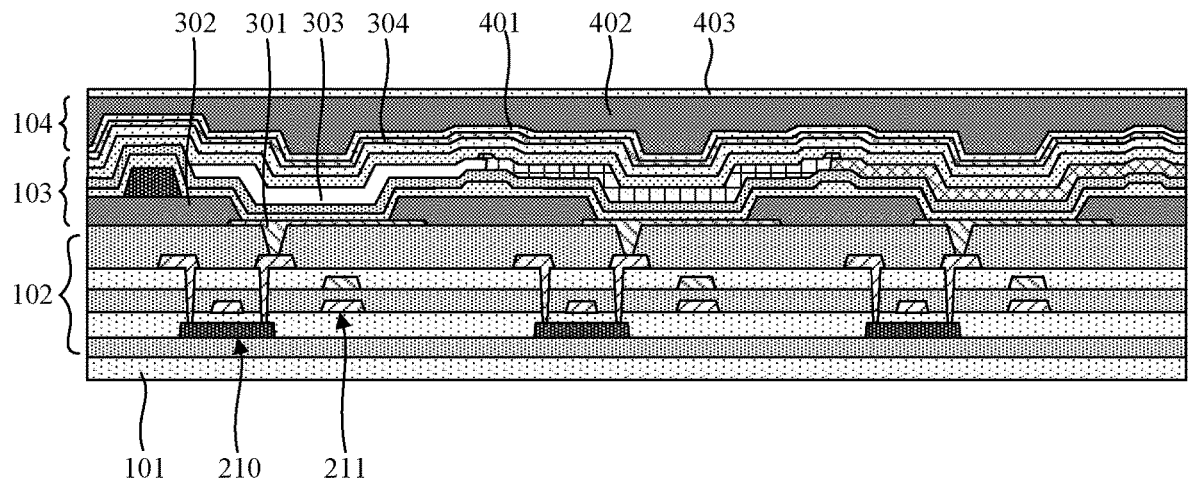
FIG. 3 is a schematic diagram of a sectional structure of a display substrate.

FIG. 3 is a schematic diagram of a sectional structure of a display substrate, and illustrates a structure of three sub-pixels of the display substrate. As shown in FIG. 3, on a plane perpendicular to the display substrate, the display substrate may include a drive circuit layer 102 disposed on a substrate 101, a light emitting structure layer 103 disposed at a side of the drive circuit layer 102 away from the substrate, and an encapsulation layer 104 disposed at a side of the light emitting structure layer 103 away from the substrate. In some possible implementation modes, the display substrate may include another film layer, such as post spacer, which is not limited in the present disclosure.

In an exemplary implementation mode, the base substrate 101 may be a flexible base substrate, or a rigid base substrate. The drive circuit layer 102 of each sub-pixel may include a plurality of signal lines and a pixel drive circuit, the pixel drive circuit may include a plurality of transistors and a storage capacitor. In FIG. 3, only one drive transistor 210 and one storage capacitor 211 are taken as an example for illustration. The light emitting structure layer 103 of each sub-pixel may include a plurality of film layers forming a light emitting device, the plurality of film layers may include an anode 301, a pixel define layer 302, an organic light emitting layer 303, and a cathode 304. The anode 301 is connected with a drain electrode of a drive transistor 210 through a via. The organic light emitting layer 303 is connected with the anode 301. The cathode 304 is connected with the organic light emitting layer 303. The organic light emitting layer 303 is driven by the anode 301 and the cathode 304 to emit light of a corresponding color. The encapsulation layer 104 may include a first encapsulation layer 401, a second encapsulation layer 402, and a third encapsulation layer 403 that are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403 so as to prevent external water vapor from entering the light emitting structure layer 103.

In an exemplary implementation, the organic light emitting layer 303 may include a hole injection layer (HIL), a hole transport layer (HTL), an electron block layer (EBL), a light emitting layer (EML), a hole block layer (HBL), an electron transport layer (ETL) and an electron injection layer (EIL) that are stacked. In an exemplary implementation, the hole injection layers and the electron injection layers of all the sub-pixels may be connected together as a common layer, the hole transport layers and the electron transport layers of all the sub-pixels may be connected together as a common layer, the hole block layers of all the sub-pixels may be connected together as a common layer, and the light emitting layers and the electron block layers of adjacent sub-pixels may be slightly overlapped with each other, or may be isolated from each other.

Figure 4:
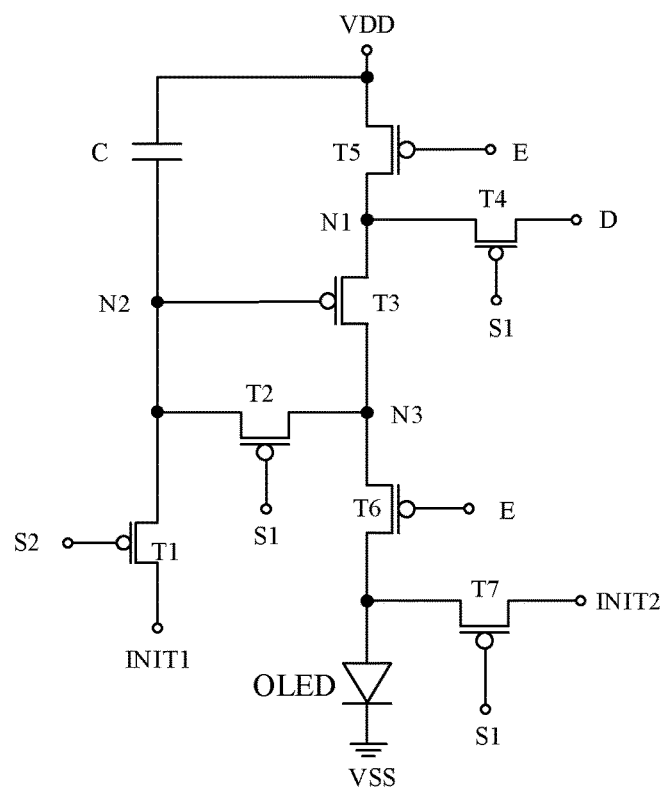
FIG. 4 is a schematic diagram of an equivalent circuit of a pixel drive circuit.

In an exemplary implementation, the pixel drive circuit may be of a 3T1C, 4T1C, 5T1C, 5T2C, 6T1C, 7T1C or 8T1C structure. FIG. 4 is a schematic diagram of an equivalent circuit of a pixel drive circuit. As shown in FIG. 4, the pixel drive circuit may include seven transistors (a first transistor T1 to a seventh transistor T7), one memory capacitor C, and the pixel drive circuit is respectively connected with eight signal lines (a data signal line D, a first scan signal line S1, a first scan signal line S2, a light emitting signal line E, a first initial signal line INIT1, a second initial signal line INIT2, a first power supply line VDD, and a second power supply line VSS).

In an exemplary implementation, the pixel drive circuit may include a first node N1, a second node N2, and a third Node N3. The first node N1 is respectively connected with a first electrode of the third transistor T3, a second electrode of the fourth transistor T4 and a second electrode of the fifth transistor T5, the second node N2 is respectively connected with a second electrode of the first transistor, a first electrode of the second transistor T2, a control electrode of the third transistor T3 and the second terminal of the storage capacitor C, and the third node N3 is respectively connected with a second electrode of the second transistor T2, a second electrode of the third transistor T3 and a first electrode of the sixth transistor T6.

In an exemplary implementation mode, a first terminal of the storage capacitor C is connected with the first power supply line VDD, and a second terminal of the storage capacitor C is connected with a second node N2, namely the second terminal of the storage capacitor C is connected with a control electrode of the third transistor T3.

A control electrode of the first transistor T1 is connected with the second scan signal line S2, a first electrode of the first transistor T1 is connected with the first initial signal line INIT1, and a second electrode of the first transistor is connected with the second node N2. When a scan signal with an on-level is applied to the second scan signal line S2, the first transistor T1 transmits a first initial voltage to the control electrode of the third transistor T3 so as to initialize a charge amount of the control electrode of the third transistor T3.

A control electrode of the second transistor T2 is connected with the first scan signal line S1, a first electrode of the second transistor T2 is connected with the second node N2, and a second electrode of the second transistor T2 is connected with a third node N3. When a scan signal with an on-level is applied to the first scan signal line S1, the second transistor T2 enables the control electrode of the third transistor T3 to be connected with the second electrode of the third transistor T3.

The control electrode of the third transistor T3 is connected with the second node N2, namely the control electrode of the third transistor T3 is connected with the second terminal of the storage capacitor C, a first electrode of the third transistor T3 is connected with a first node N1, and a second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

A control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4 may be referred to as a switch transistor, a scanning transistor, etc., and when a scan signal with an on-level is applied to the first scan signal line S1, the fourth transistor T4 enables a data voltage of the data signal line D to be input to the pixel drive circuit.

A control electrode of the fifth transistor T5 is connected with the light emitting signal line E, a first electrode of the fifth transistor T5 is connected with the first power supply line VDD, and a second electrode of the fifth transistor T5 is connected with the first node N1. A control electrode of the sixth transistor T6 is connected with the light emitting signal line E, a first electrode of the sixth transistor T6 is connected with the third node N3, and a second electrode of the sixth transistor T6 is connected with a first electrode of the light emitting device. The fifth transistor T5 and the sixth transistor T6 may be referred to as light emitting transistors. When a light emitting signal with an on-level is applied to the light emitting signal line E, the fifth transistor T5 and the sixth transistor T6 form a drive current path between the first power supply line VDD and the second power supply line VSS to enable the light emitting device to emit light.

A control electrode of the seventh transistor T7 is connected with the first scan signal line S1, a first electrode of the seventh transistor T7 is connected with the second initial signal line INIT2, and a second electrode of the seventh transistor T7 is connected with a first electrode of the light emitting device. When a scan signal with an on-level is applied to the first scan signal line S1, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary implementation, the light emitting device may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, a second electrode of the light emitting device is connected with the second power supply line VSS, a signal of the second power supply line VSS is a low-level signal, and a signal of the first power supply line VDD is a high-level signal continuously provided. The first scan signal line S1 is a scan signal line in the pixel drive circuit of a present display row, and the second scan signal line S2 is a scan signal line in the pixel drive circuit of a previous display row. That is, for an N-th display row, the first scan signal line S1 is S(n), and the second scan signal line S2 is S(n−1). The second scan signal line S2 of the present display row and the first scan signal line S1 in the pixel drive circuit of the previous display row are the same signal line. Signal lines of the display panel may be reduced, so that the display panel has a narrow bezel.

In an exemplary implementation mode, the first transistor T1 to the seventh transistor T7 may be P-type transistors or N-type transistors. Use of the same type of transistors in a pixel drive circuit may simplify a process flow, reduce process difficulties of a display panel, and improve a yield of a product. In some possible implementations, the first transistor T1 to the seventh transistor T7 may include P-type transistors and N-type transistors.

In an exemplary implementation mode, the first transistor T1 to the seventh transistor T7 may be low temperature poly-silicon thin film transistors, or may be oxide thin film transistors, or may be both low temperature poly-silicon thin film transistors and oxide thin film transistors. An active layer of the low temperature poly-silicon thin film transistor may be made of Low Temperature Poly-Silicon (LTPS for short), and an active layer of the oxide thin film transistor may be made of an Oxide semiconductor. The low temperature poly-silicon thin film transistor has advantages such as high migration rate and fast charging. The oxide thin film transistor has advantages such as low drain current. The low temperature poly-silicon thin film transistor and the oxide thin film transistor are integrated on one display substrate to form a Low Temperature Polycrystalline Oxide (LTPO for short) display substrate, so that advantages of the low temperature poly-silicon thin film transistor and the oxide thin film transistor can be utilized, low-frequency drive can be realized, power consumption can be reduced, and display quality can be improved.

Figure 5:
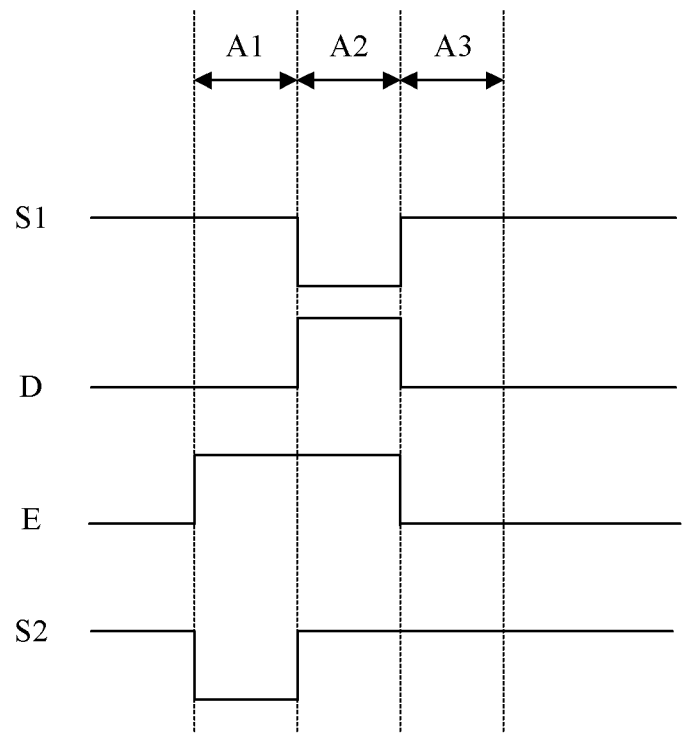
FIG. 5 is a working timing diagram of a pixel drive circuit.

FIG. 5 is a working timing diagram of a pixel drive circuit. The exemplary embodiment of the present disclosure will be described below through a working process of the pixel drive circuit shown in FIG. 4. In FIG. 4, the pixel drive circuit includes seven thin film transistors (a first transistor T1 to a seventh transistor T7), one storage capacitor C, and eight signal lines (a data signal line D, a first scan signal line S1, a first scan signal line S2, a light emitting signal line E, a first initial signal line INIT1, a second initial signal line INIT2, a first power supply line VDD, and a second power supply line VSS). All the seven transistors are P-type transistors.

In an exemplary implementation, taking an OLED as example, the working process of the pixel drive circuit may include the following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is the low-level signal, so that the first transistor T1 is turned on, a first initial voltage of the first initial signal line INIT1 is provided to the second node N2 to initialize the storage capacitor C, thereby clearing an original data voltage in the storage capacitor. The signals of the first scan signal line S1 and the light emitting signal line E are high-level signals, so that the second transistor T2, the fourth transistor T4, the fifth transistor T5, the sixth transistor T6, and the seventh transistor T7 are turned off. The OLED does not emit light in this stage.

In a second stage A2, referred to as a data writing stage or a threshold compensation stage, the signal of the first scan signal line S1 is a low-level signal, the signals of the second scan signal line S2 and the light emitting signal line E are high-level signals, and the data signal line D outputs a data voltage. In this stage, the second terminal of the storage capacitor C is at a low level, so that the third transistor T3 is turned on. The signal of the first scan signal line S1 is the low-level signal, so that the second transistor T2, the fourth transistor T4, and the seventh transistor T7 are turned on. The second transistor T2 and the fourth transistor T4 are turned on, so that the data voltage output by the data signal line D is provided to the second node N2 through the first node N1, the turned-on third transistor T3, the third node N3, and the turned-on second transistor T2, and the storage capacitor C is charged with a difference between the data voltage output by the data signal line D and a threshold voltage of the third transistor T3. A voltage at a second terminal (the second node N2) of the storage capacitor C is Vd−|Vth|, wherein Vd is the data voltage output by the data signal line D, and Vth is the threshold voltage of the third transistor T3. The seventh transistor T7 is turned on, so that the second initial voltage of the second initial signal line INIT2 is provided to a first electrode of the OLED to initialize (reset) the first electrode of the OLED and clear its internal pre-stored voltage, thereby completing initialization and ensuring that the OLED does not emit light. The signal of the second scan signal line S2 is the high-level signal, so that the first transistor T1 is turned off. The signal of the light emitting signal line E is a high-level signal, so that the fifth transistor T5 and the sixth transistor T6 are turned off.

In a third stage A3, referred to as a light emitting stage, the signal of the light emitting signal line E is a low-level signal, and the signals of the first scan signal line S1 and the second scan signal line S2 are high-level signals. The signal of the light emitting signal line E is the low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. A voltage of the second node N2 is Vdata−|Vth|, so that the drive current of the third transistor T3 is as follows.

$$I = K*(Vgs - Vth)^2 = K*[(Vdd - Vd + |Vth|) - Vth]2 = K*[(Vdd - Vd]^2$$

I is the drive current flowing through the third transistor T3, i.e., a drive current for driving the OLED, K is a constant, Vgs is the voltage difference between the gate electrode and first electrode of the third transistor T3, Vth is the threshold voltage of the third transistor T3, Vd is the data voltage output by the data signal line D, and Vdd is the power voltage output by the first power supply line VDD.

With the development of OLED display technologies, consumers have higher requirements for the display effect of display products. Super-narrow bezels have become a new trend in the development of display products. Therefore, bezel narrowing or even a bezel-less design has received more attention in the design of OLED display products. A display substrate generally includes a display region and a bonding region located at a side of the display region. The bonding region may at least include a first fan-out region, a bending region, a drive chip region and a bonding pin region sequentially arranged along a direction away from the display region. The first fan-out region at least includes a data fan-out line. A plurality of data fan-out lines are configured to be connected with data signal lines of the display region in a fan-out wiring manner. The bending region may include a composite insulating layer provided with a groove, and is configured to bend the bonding region to the back of the display region. The drive chip region may include an Integrated Circuit (IC for short) and is configured to be connected with the plurality of data fan-out lines. The bonding pin region may include Bonding Pads, and is configured to be bonded to an external Flexible Printed Circuit (FPC for short). Generally, a width of the bonding region is smaller than a width of the display region, the signal lines of the integrated circuit and the bonding pad in the bonding region need to be fanned out through the first fan-out region to be lead into the wider display region, the greater the width difference between the display region and the bonding region, the more oblique fan-out lines in the fan region, the longer the distance between the drive chip region and the display region, so the fan region occupies a large space, which makes it difficult to narrow the lower bezel, and the lower bezel is always maintained at about 2.0 mm.

Figure 6:
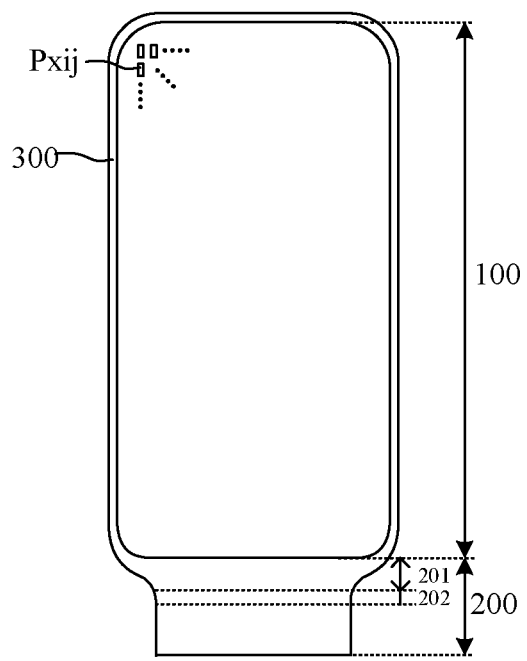
FIG. 6 is a schematic diagram of a planar structure of a display substrate according to an exemplary embodiment of the present disclosure.

FIG. 6 is a schematic diagram of a planar structure of a display substrate according to an exemplary embodiment of the present disclosure. As shown in FIG. 6, the display substrate 10 may include a display region 100, a bonding region 200 at a side of the display region 100, and a bezel region 300 at other sides of the display region 100. In an exemplary implementation, the display region 100 may be a planar region, including a plurality of sub-pixels Pxij forming a pixel array, a plurality of data signal lines, and a plurality of data fan-out lines. The plurality of sub-pixels are configured to display a dynamic picture or a static image; the plurality of data signal lines are configured to provide data signals to the plurality of sub-pixels Pxij; the plurality of data fan-out lines are correspondingly connected with the plurality of data lines, and are configured to make the plurality of data signal lines to be connected with a plurality of lead lines in the bonding region 200 through the plurality of data fan-out lines. In an exemplary implementation, the display substrate may be a flexible substrate, and accordingly the display substrate can be deformed, for example, can be crimped, bent, folded, or curled.

In an exemplary implementation, the display region 100 may include a plurality of pixel units arranged in a matrix manner, and at least one pixel unit may include a red sub-pixel R that emits red light, a blue sub-pixel B that emits blue light, a first green sub-pixel G1 that emits green light, and a second green sub-pixel G2 that emits green light. In an exemplary implementation, the red sub-pixel R may include a red light emitting device emitting red light and a red circuit unit connected with the red light emitting device, the blue sub-pixel B may include a blue light emitting device emitting blue light and a blue circuit unit connected with the blue light emitting device, the first green sub-pixel G1 may include a first green light emitting device emitting green light and a first green circuit unit connected with the first green light emitting device, the second green sub-pixel G2 may include a second green light emitting device emitting green light and a second green circuit unit connected with the second green light emitting device, the red circuit unit, the blue circuit unit, the first green circuit unit and the second green circuit unit form one circuit unit group, and four circuit units in at least one circuit unit group may be arranged in a square manner. In an exemplary implementation, a plurality of sub-pixels may form a plurality of pixel rows and a plurality of pixel columns, and a plurality of circuit units may form a plurality of circuit unit rows and a plurality of circuit unit columns. A sub-pixel in the present disclosure refers to a region divided according to a light emitting device, and a circuit unit in the present disclosure refers to a region divided according to a pixel drive circuit. In an exemplary implementation, positions of both the sub-pixels and the circuit units may be corresponding or the positions of both the sub-pixels and the circuit units may be not corresponding.

In an exemplary implementation, the bonding region 200 may include a lead region 20, a bending region 202, a drive chip region, and a bonding pin region which are sequentially disposed along a direction away from the display region, and the lead region 201 is connected with the display region 100, the bending region 202 is connected with the lead region 201

In an exemplary implementation, the lead region 201 may be provided with a plurality of lead lines which are mutually parallel. The plurality of lead lines extend along the direction away from the display region, and ends of the plurality of lead lines are correspondingly connected with the plurality of data fan-out lines in the display region 100, and the other ends of the plurality of lead lines go cross the bending region 202 to be connected with an integrated circuit of the drive chip region, so that the integrated circuit applies data signals to the data signal lines through the lead lines and the data fan-out lines. Because there is no need to dispose fan-shaped oblique lines in the lead region, a length of the lead region in the vertical direction is effectively reduced, and a width of the lower bezel is greatly reduced, so that widths of the upper bezel, the lower bezel, the left bezel and the right bezel of the display apparatus are similar and all below 1.0 mm, which increases a screen-to-body ratio and is beneficial to achieving bezel-less display.

Figure 7:
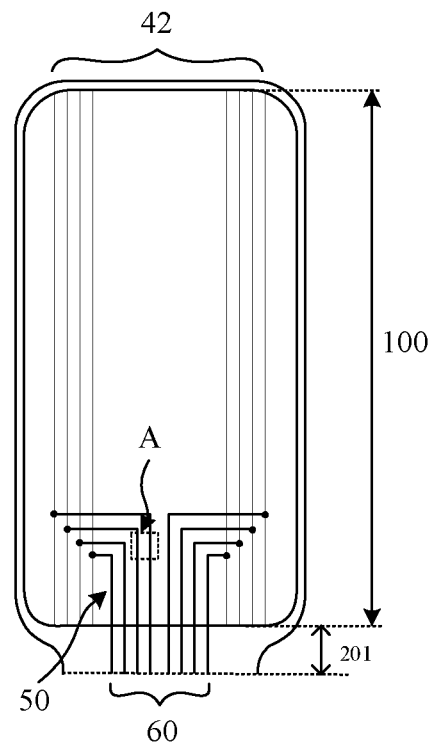
FIG. 7 is a schematic diagram of a structure of a data signal line and a data fan-out line according to an exemplary embodiment of the present disclosure.

FIG. 7 is a schematic diagram of a structure of data signal lines and data fan-out lines according to an exemplary embodiment of the present disclosure. As shown in FIG. 7, the display region 100 may include a plurality of data signal lines 42 and a plurality of data fan-out lines 50. The lead region 201 of the bonding region may include a plurality of lead lines 60. In an exemplary implementation, the plurality of data signal lines 42 may extend in a direction of a circuit unit column and be sequentially arranged at a set interval along a direction of a circuit unit row, each of the data signal line 42 is connected with pixel drive circuits of all circuit units in one circuit unit column in the display region 100. First ends of the plurality of data fan-out lines 50 are correspondingly connected with the plurality of data signal lines 42, and second ends of the plurality of data fan-out lines 50 are correspondingly connected with the plurality of lead lines 60 of the lead region 201, so that the plurality of data signal lines 42 in the display region 100 are correspondingly connected with the plurality of lead lines 60 in the bonding region 200 through the plurality of data fan-out lines 50 in the display region 100.

In an exemplary implementation, the quantity of data fan-out lines in the display region may be the same as the quantity of data signal lines, each of the data signal line is correspondingly connected with one of the lead lines through one of the data fan-out lines. Alternatively, the quantity of data fan-out lines in the display region may be smaller than the quantity of data signal lines, and a part of the data signal lines in the display region is connected with the lead lines correspondingly through the data fan-out lines, and the other part of the data signal lines is directly connected with the lead lines, which is not limited in the present disclosure.

The present disclosure provides a display substrate including a drive circuit layer disposed on a substrate, wherein the drive circuit layer includes a plurality of circuit units, at least one circuit unit includes a pixel drive circuit, a first power supply line providing a power supply signal to the pixel drive circuit, a data signal line providing a data signal to the pixel drive circuit, and a data fan-out line connected with the data signal line; at least one first power supply line, the data signal line, and the data fan-out line extend along a first direction and are arranged at intervals along a second direction. At least one data fan-out line is disposed between the first power supply line and the data signal line, the first direction intersects with the second direction.

In an exemplary implementation, the data fan-out line is connected with the data signal line through a via.

In an exemplary implementation, an orthographic projection of the data fan-out line in a plane of the display substrate is not overlapped with an orthographic projection of the first power supply line in the plane of the display substrate, and the orthographic projection of the data fan-out line in the plane of the display substrate is not overlapped with an orthographic projection of the data signal line in the plane of the display substrate.

In an exemplary implementation, the data fan-out line at least includes a first data fan-out line disposed between the first power supply line and the data signal line.

In an exemplary implementation, the at least one circuit unit further includes an initial signal line providing an initial signal to the pixel drive circuit, the initial signal line includes a first initial signal line of which a body portion extends along the first direction and an initial signal connection line of which a body portion extends along the second direction, the initial signal connection line is connected with the first initial signal line through a via; an orthographic projection of the data fan-out line in the plane of the display substrate is at least partially overlapped with an orthographic projection of the initial signal connection line in the plane of the display substrate.

In an exemplary implementation, the initial signal connection line is connected with the first initial signal line through a via.

In an exemplary implementation, the data fan-out line at least includes a second data fan-out line, an orthographic projection of the second data fan-out line in the plane of the display substrate is at least partially overlapped with an orthographic projection of the initial signal connection line in the plane of the display substrate.

Figure 8:
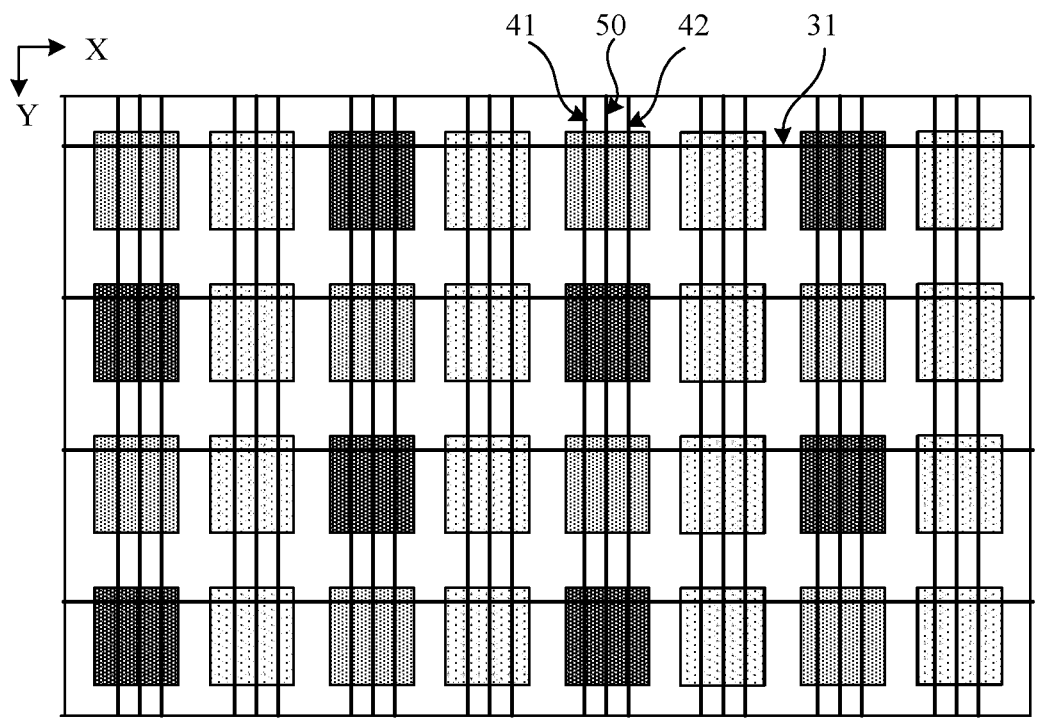
FIG. 8 is schematic diagram of a data fan-out line in a drive circuit layer according to an exemplary embodiment of the present disclosure.

FIG. 8 is schematic diagram of a data fan-out line in a drive circuit layer according to an exemplary embodiment of the present disclosure. As shown in FIG. 8 and in conjunction with FIG. 2, in a plane parallel to the display substrate, the drive circuit layer may include a plurality of circuit units, a plurality of circuit units sequentially arranged along a first direction X are referred to as a circuit unit row, and a plurality of circuit units sequentially arranged along a second direction Y are referred to as a circuit unit column. A plurality of circuit unit rows and a plurality of circuit unit columns form an array of circuit units arranged in an array, with the first direction X intersecting with the second direction Y. In an exemplary implementation, the first direction X may be an extension direction of the scan signal line (horizontal direction), the second direction Y may be an extension direction of the data signal line (vertical direction), and the first direction X and the second direction Y may be perpendicular to each other.

In an exemplary implementation, at least one circuit unit row is provided with a first initial signal line 31 which may extend along the first direction X. At least one circuit unit column is provided with a first power supply line 41, a data signal line 42, and a data fan-out line 50, wherein the first power supply line 41, the data signal line 42 and the data fan-out line 50 may all extend along the second direction Y and are arranged at intervals along the first direction X. In an exemplary implementation, in the second direction Y, the data fan-out line 50 may be disposed between the first power supply line 41 and the data signal line 42, an orthographic projection of the data fan-out line 50 in the plane of the display substrate is not overlapped with an orthographic projection of the first power supply line 41 in the plane of the display substrate, and the orthographic projection of the data fan-out line 50 in the plane of the display substrate is not overlapped with an orthographic projection of the data signal line 42 in the plane of the display substrate.

Figure 9:
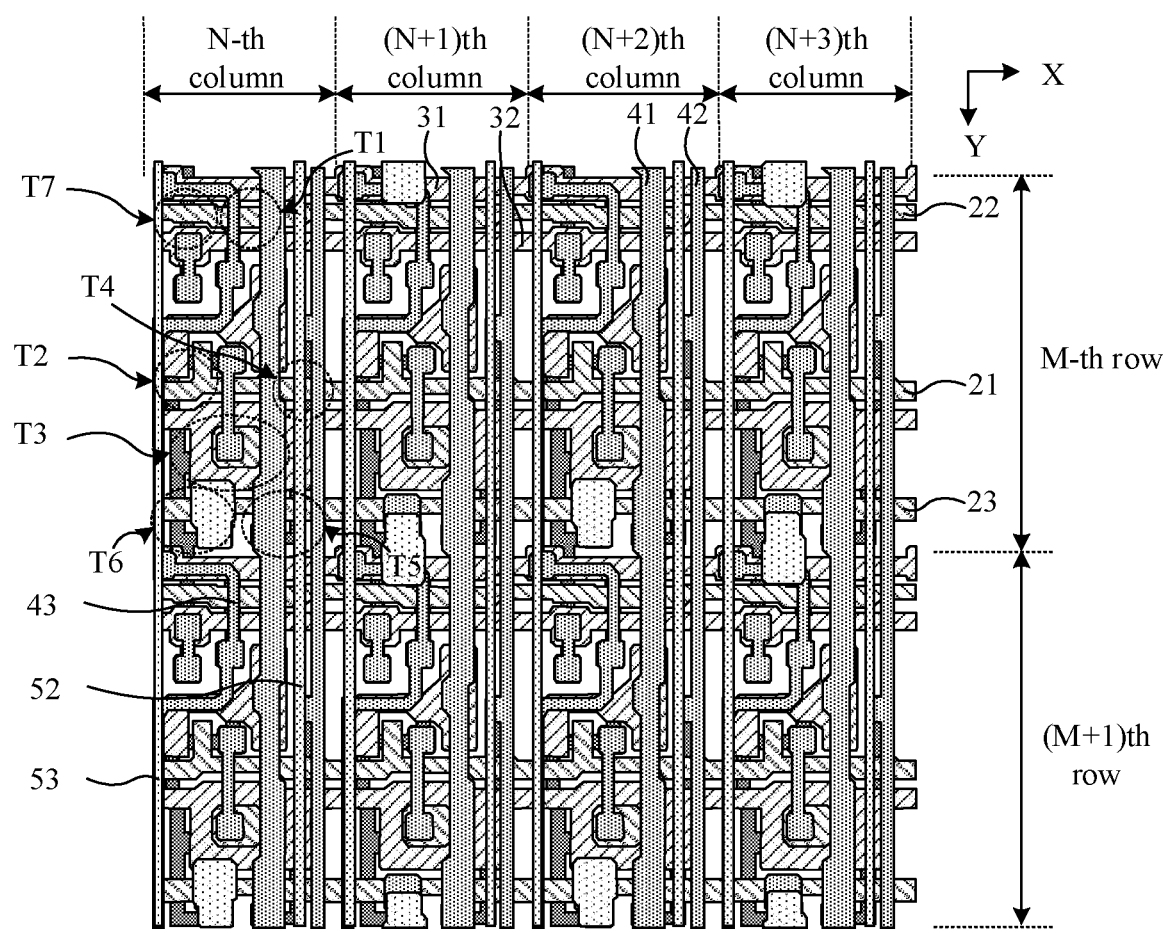
FIG. 9 is a schematic diagram of a structure of a drive circuit layer according to an exemplary embodiment of the present disclosure.

FIG. 9 is a schematic diagram of a structure of a drive circuit layer of an exemplary embodiment of the present disclosure, illustrating a planar structure of eight circuit units (two circuit unit rows and four circuit unit columns), FIG. 9 is an enlarged view of region A in FIG. 7. As shown in FIG. 9, in a plane parallel to the display substrate, at least one circuit unit may include: a first scan signal line 21, a second scan signal line 22, a light emitting signal line 23, a first initial signal line 31, a second initial signal line 32, a first power supply line 41, a data signal line 42, an initial signal connection line 43, a first data fan-out line 52, a second data fan-out line 53, and a pixel drive circuit, the pixel drive circuit may include a storage capacitor and seven transistors including a first transistor T1, a second transistor T2, a third transistor T3, a fourth transistor T4, a fifth transistor T5, a sixth transistor T6, and a seventh transistor T7, and in which the third transistor may be a drive transistor.

In an exemplary implementation, body portions of the first scan signal line 21, the second scan signal line 22, the light emitting signal line 23, the first initial signal line 31 and the second initial signal line 32 may extend along the first direction X, and body portions of the first power supply line 41, the data signal line 42, the initial signal connection line 43, the first data fan-out line 52 and the second data fan-out line 53 may extend along the second direction Y.

In some exemplary implementations, in a plane perpendicular to the display substrate, the drive circuit layer may at least include a semiconductor layer, a first conductive layer, a second conductive layer, and a third conductive layer, and a fourth conductive layer that are sequentially disposed on the substrate. In an exemplary implementation, the semiconductor layer may include active layers of a plurality of transistors, the first conductive layer may include the first scan signal line 21, the second scan signal line 22, gate electrodes of the plurality of transistors, and a first electrode plate of a storage capacitor, the second conductive layer may include the first initial signal line 31, the second initial signal line 32, and a second electrode plate of the storage capacitor, the third conductive layer may include a first power supply line 41, the data signal line 42, the initial signal connection line 43, and first electrode and second electrode of the plurality of transistors, and the fourth conductive layer may include the first data fan-out line 52 and the second data fan-out line 53.

In an exemplary implementation, the initial signal connection line 43 located in the third conductive layer may be connected with the first initial signal line 31 located in the second conductive layer through a via, so that the first initial signal line of which a body portion extends along the first direction X and the initial signal connection line 43 of which a body portion extends along the second direction Y form a grid shape, and the first initial signal lines 31 in a plurality of circuit unit rows and a plurality of circuit unit columns have the same potential.

In an exemplary implementation, the drive circuit layer may include a first insulating layer, a second insulating layer, a third insulating layer, a fourth insulating layer and a fifth insulating layer. The first insulating layer is disposed between the substrate and the semiconductor layer, the second insulating layer is disposed between the semiconductor layer and the first conducting layer, the third insulating layer is disposed between the first conducting layer and the second conducting layer, the fourth insulating layer is disposed between the second conducting layer and the third conducting layer, and the fifth insulating layer is disposed between the third conducting layer and the fourth conducting layer.

In an exemplary implementation, at least a portion of the first data fan-out line 52 is disposed between the first power supply line 41 and the data signal line 42, an orthographic projection of the first data fan-out line 52 in the plane of the display substrate is not overlapped with an orthographic projection of the first power supply line 41 in the plane of the display substrate, the orthographic projection of the first data fan-out line 52 in the plane of the display substrate is not overlapped with an orthographic projection of a body portion of the data signal line 42 in the plane of the display substrate, wherein the body portion of the data signal line 42 refers to a portion of the data signal line 42 extending along the second direction Y.

In an exemplary implementation, an orthographic projection of the second data fan-out line 53 in the plane of the display substrate may be at least partially overlapped with an orthographic projection of the initial signal connection line 43 in the plane of the display substrate.

Exemplary description is made below through a process of manufacturing a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a substrate through a process such as depositing, coating, or the like. If the "thin film" does not need a patterning process in an entire preparation process, the "thin film" may also be referred to as a "layer". If the "thin film" needs the patterning process in the entire preparation process, it is referred to as a "thin film" before the patterning process, and referred to as a "layer" after the patterning process. The "layer" which has experienced the patterning process includes at least one "pattern". "A and B being disposed in the same layer" in the present disclosure means that A and B are formed simultaneously through a single patterning process, and the "thickness" of a film layer is the dimension of the film layer in a direction perpendicular to the display substrate. In an exemplary embodiment of the present disclosure, "an orthographic projection of B is within the range of an orthographic projection of A" or "an orthographic projection of A contains an orthographic projection of B" refers to a boundary of the orthographic projection of B falling within a boundary range of the orthographic projection of A, or the boundary of the orthographic projection of A is overlapped with the boundary of the orthographic projection of B.

In an exemplary embodiment, taking eight circuit units (2 circuit unit rows and 4 circuit unit columns) as an example, the preparation process for the drive circuit layer may include the following operations.

Figure 10:
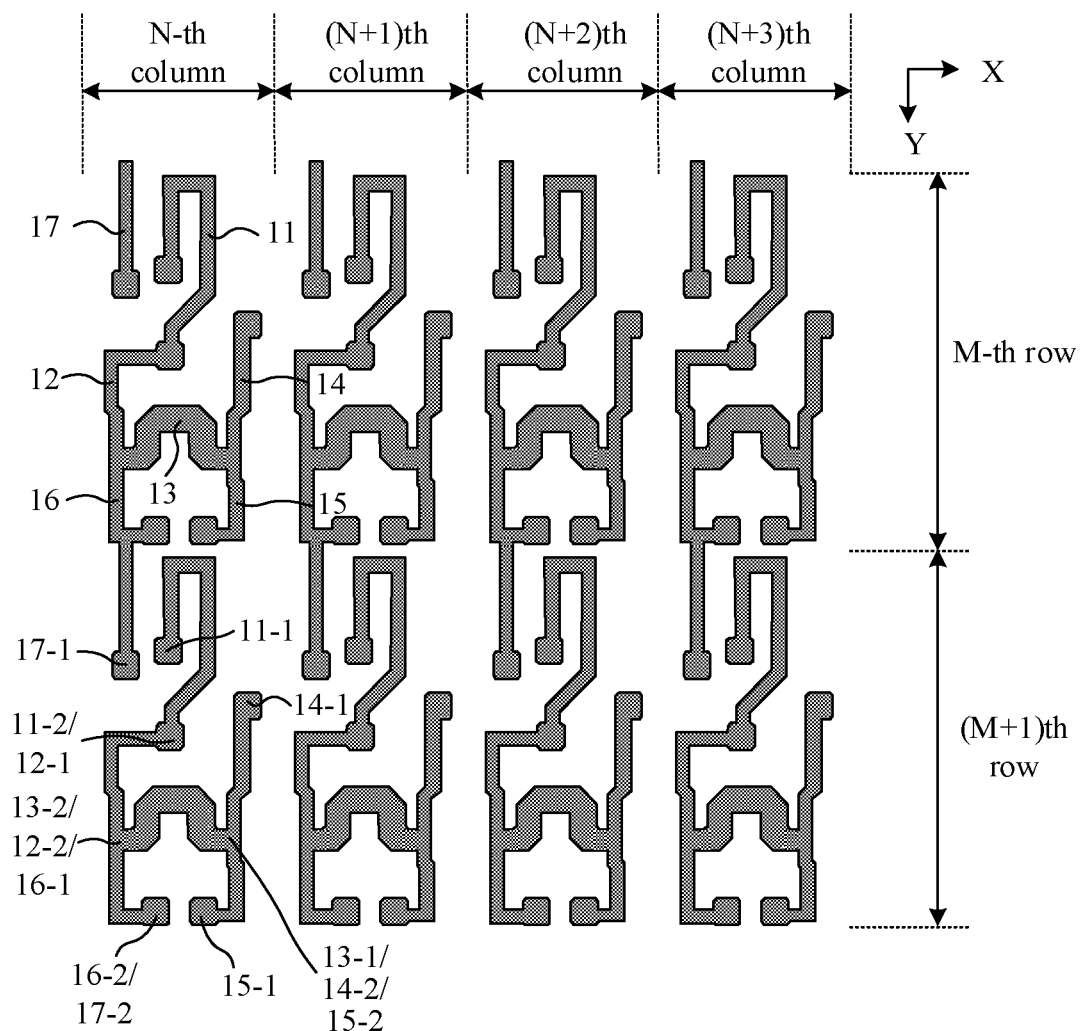
FIG. 10 is a schematic diagram obtained after a semiconductor layer pattern of a display substrate is formed according to the present disclosure.

(1) Forming a pattern of a semiconductor layer. In an exemplary embodiment, forming a pattern of a semiconductor layer may include: depositing sequentially a first insulating thin film and a semiconductor thin film on a substrate, and patterning the semiconductor thin film through a patterning process to form a first insulating layer overlying the substrate and a semiconductor layer disposed on the first insulating layer, as shown in FIG. 10.

In an exemplary embodiment, the semiconductor layer of each circuit unit may include a first active layer 11 of a first transistor T1 to a seventh active layer 17 of a seventh transistor T7, and the first active layer 11 to the seventh active layer 17 form an integrated structure connected with each other, the sixth active layer 16 of a M-th circuit unit row in each circuit unit column and the seventh active layer 17 of a (M+1)th circuit unit row are connected with each other, that is, the semiconductor layers of adjacent circuit units in each circuit unit column form an integrated structure connected with each other.

In an exemplary embodiment, the first active layer 11, the second active layer 12, the fourth active layer 14 and the seventh active layer 17 in the M-th circuit unit row are located at a side of the third active layer 13 of the circuit unit away from the (M+1)th circuit unit row, the first active layer 11 and the seventh active layer 17 are located at a side of the second active layer 12 and the fourth active layer 14 away from the third active layer 13, and the fifth active layer 15 and the sixth active layer 16 in the M-th circuit unit row are located at a side of the third active layer 13 close to the (M+1)th circuit unit row.

In an exemplary embodiment, the first active layer 11 may be shaped like "n", the second active layer 12 may be shaped like "7", the third active layer 13 may be shaped like a Chinese character "几", the fourth active layer 14 and the seventh active layer 17 may be shaped like "1", and the fifth active layer 15 and the sixth active layer 16 may be shaped like "L".

In an exemplary embodiment, the active layer of each transistor may include a first region, a second region, and a channel region located between the first region and the second region. In an exemplary embodiment, a first region 11-1 of the first active layer 11, a first region 14-1 of the fourth active layer 14, a first region 15-1 of the fifth active layer 15 and a first region 17-1 of the seventh active layer 17 may be individually provided. A second region 11-2 of the first active layer 11 also serves as a first region 12-1 of the second active layer 12; a first region 13-1 of the third active layer 13 also serves as a second region 14-2 of the fourth active layer 14 and a second region 15-2 of the fifth active layer 15; a second region 13-2 of the third active layer 13 also serves as a second region 12-2 of the second active layer 12 and a first region 16-1 of the sixth active layer 16; a second region 16-2 of the sixth active layer 16 also serves as a second region 17-2 of the seventh active layer 17.

Figure 11A:
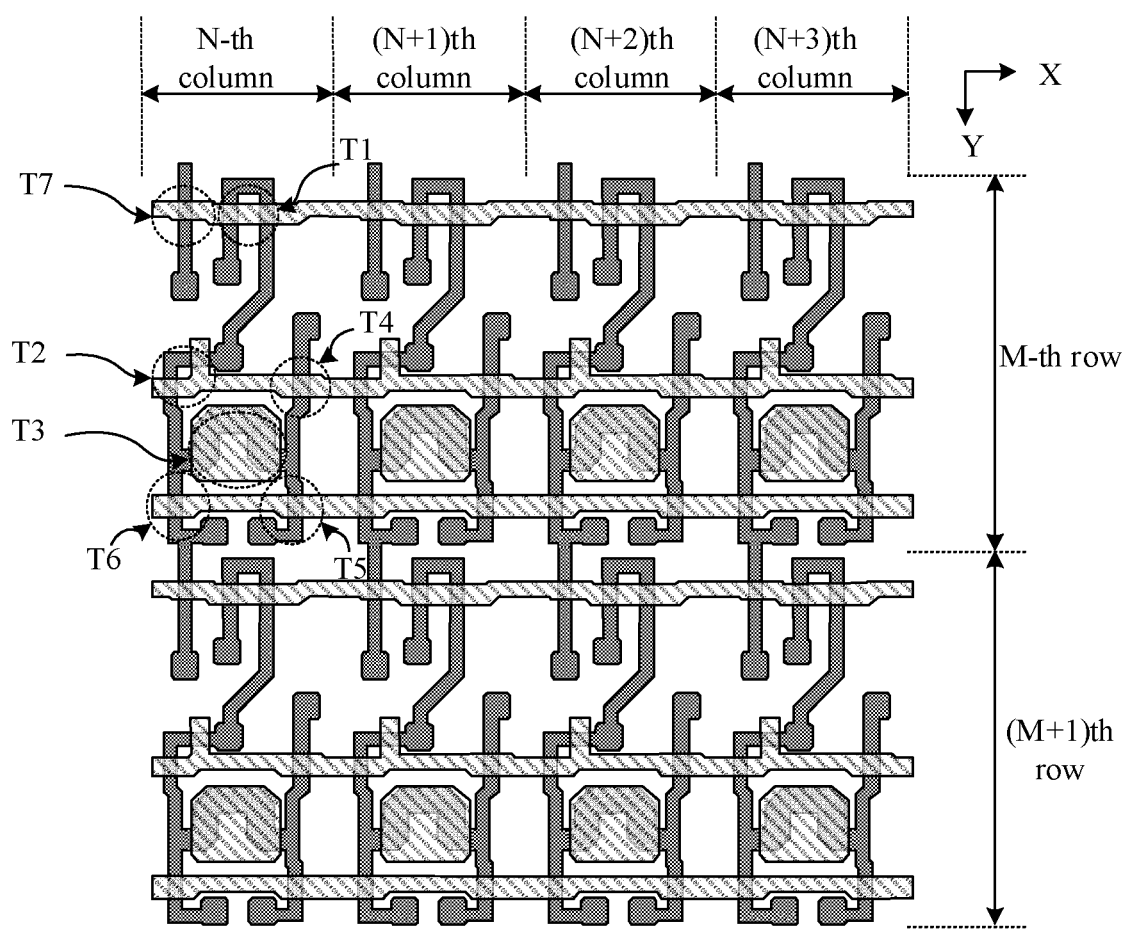
FIG. 11a is a schematic diagram of a display substrate after a pattern of a first conductive layer is formed according to the present disclosure.
Figure 11B:
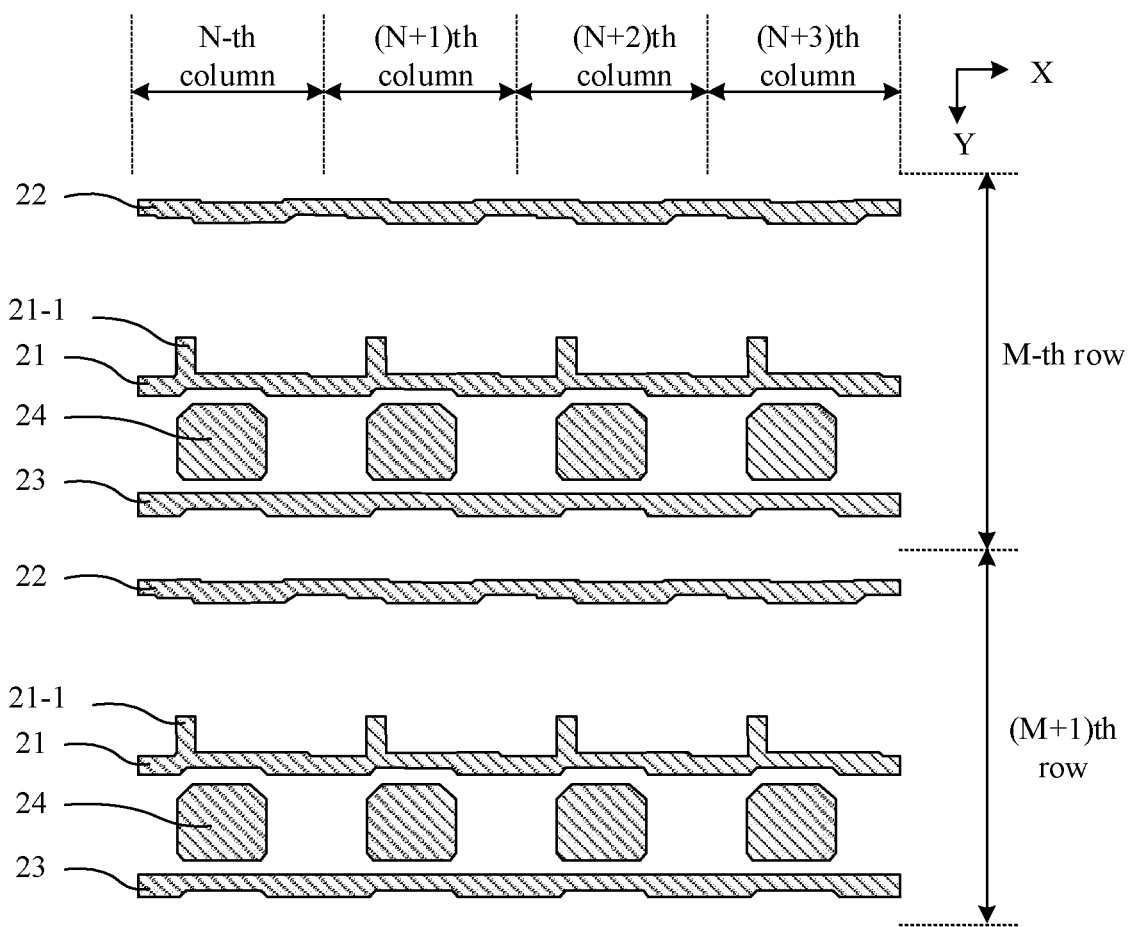

(2) Forming a pattern of a first conductive layer. In an exemplary embodiment, forming a pattern of a first conductive layer may include: sequentially depositing a second insulating thin film and a first conductive thin film on the substrate on which the above-mentioned pattern is formed, and patterning the first conductive thin film through a patterning process to form a second insulating layer that covers a pattern of the semiconductor layer and form a pattern of the first conductive layer disposed on the second insulating layer; wherein the pattern of the first conductive layer at least includes the first scan signal line 21, the second scan signal line 22, the light emitting control line 23, and the first electrode plate 24, as shown in FIG. 11a and FIG. 11b, and FIG. 11b is a planar schematic diagram of the first conductive layer in FIG. 11a. In an exemplary embodiment, the first conductive layer may be referred to as a first metal gate layer (GATE1).

As shown in conjunction with FIG. 10 to FIG. 11b, body portions of the first scan signal line 21, the second scan signal line 22, and the light emitting control line 23 extend along the first direction X. The first scan signal line 21 and the second scan signal line 22 in the M-th circuit unit row may be located at a side of the first electrode plate 24 of the present circuit unit away from the (M+1)th circuit unit row, the second scan signal line 22 is located at a side of the first scan signal line 21 of the present circuit unit away from the first electrode plate 24, and the light emitting control line 23 may be located at a side of the first electrode plate 24 of the present circuit unit close to the (M+1)th circuit unit row.

In an exemplary embodiment, the first electrode plate 24 may be rectangular, and rectangle corners may be set with chamfer. There is an overlapped region between an orthographic projection of the first electrode plate 24 on the substrate and an orthographic projection of the third active layer 13 of the third transistor T3 on the substrate. In an exemplary embodiment, the first electrode plate 24 may simultaneously serve as a electrode plate of the storage capacitor and a gate electrode of the third transistor T3.

In an exemplary embodiment, a region where the first scan signal line 21 and the second active layer 12 are overlapped serves as a gate electrode of the second transistor T2, the first scan signal line 21 is provided with a gate block 21-1 protruding toward a side of the second scan signal line 22, and there is an overlapped region between an orthographic projection of the gate block 21-1 on the substrate and an orthographic projection of the second active layer 12 on the substrate to form the second transistor T2 with a double gate structure. A region where the second scanning line 21 and the fourth active layer 14 are overlapped serves as a gate electrode of the fourth transistor T4. A region where the second scan signal line 22 and the first active layer 11 are overlapped serves as a gate electrode of the first transistor T1 with a double gate structure; a region where the second scan signal line 22 and the seventh active layer 17 are overlapped serves as a gate electrode of the seventh transistor T7; a region where the light emitting control line 23 and the fifth active layer 15 are overlapped serves as a gate electrode of the fifth transistor T5; and a region where the light emitting control line 23 and the sixth active layer 16 are overlapped serves as a gate electrode of the sixth transistor T6.

In an exemplary embodiment, after the first conductive layer pattern is formed, the semiconductor layer may be subjected to a conductive treatment by using the first conductive layer as a shield. A region of the semiconductor layer, which is shielded by the first conductive layer, forms channel regions of the first transistor T1 to the seventh transistor T7, and a region of the semiconductor layer, which is not shielded by the first conductive layer, is made to be conductive, that is, first regions and second regions of the first active layer to the seventh active layer are all made to be conductive.

Figure 12A:
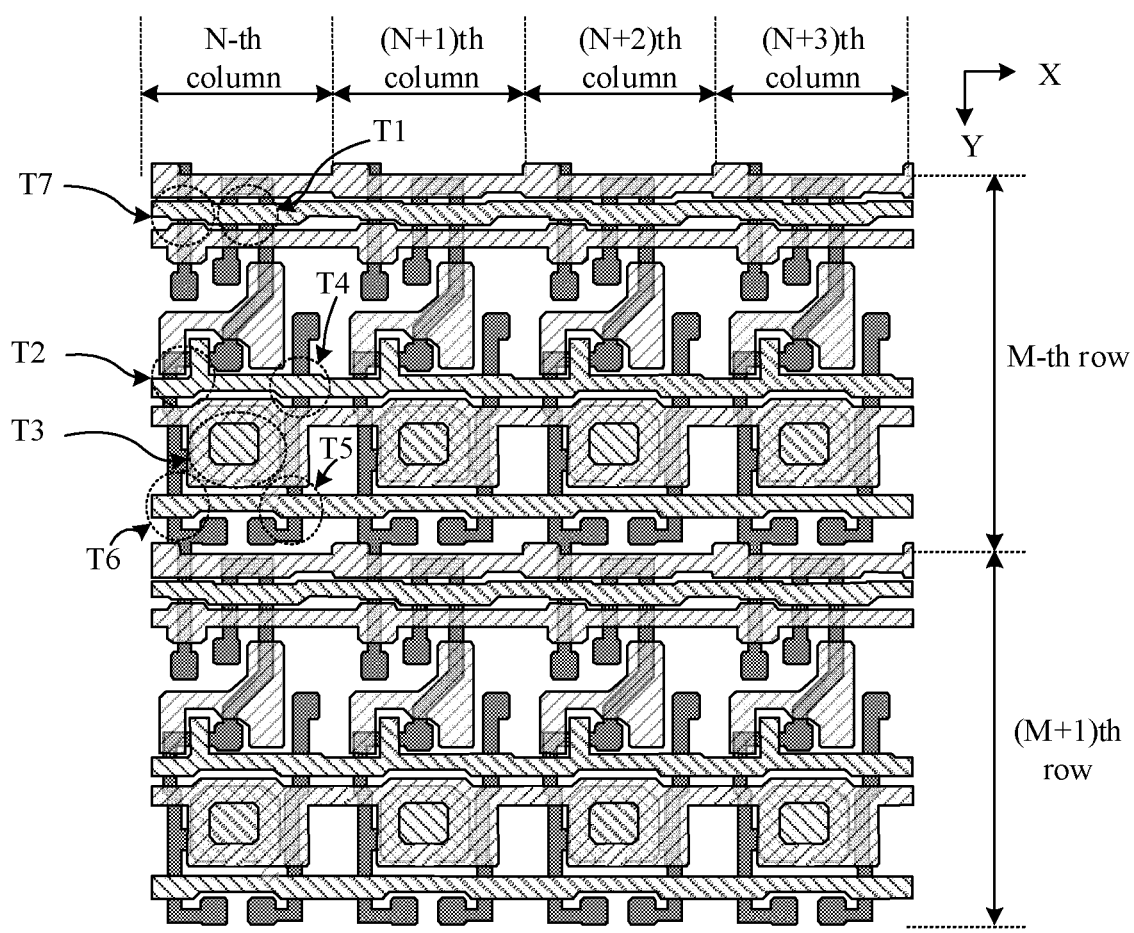
FIG. 12a is a schematic diagram of a display substrate after a pattern of a second conductive layer is formed according to the present disclosure.
Figure 12B:
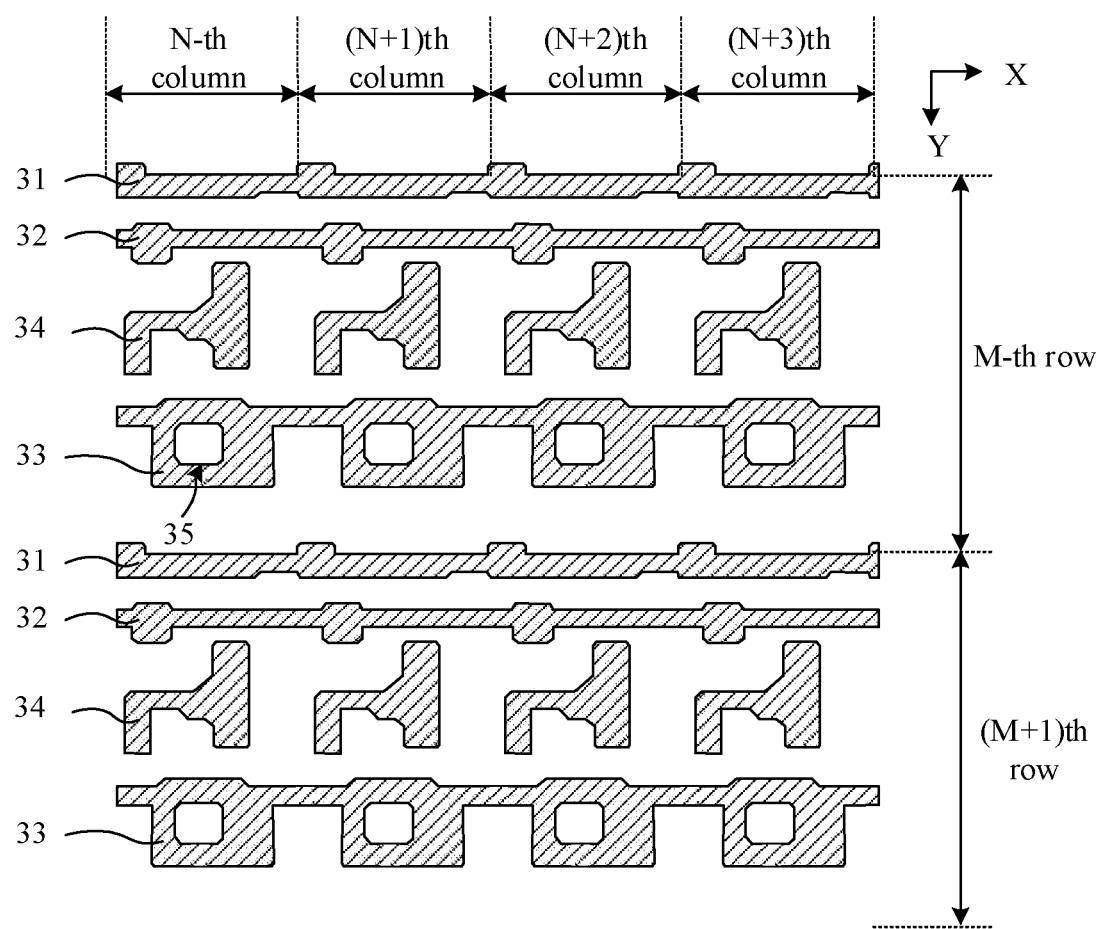

(3) Forming a pattern of a second conductive layer pattern. In an exemplary embodiment, forming a pattern of a second conductive layer may include: sequentially depositing a third insulating thin film and a second conductive thin film on the substrate on which the above-mentioned patterns are formed, and patterning the second conductive thin film through a patterning process to form a third insulating layer that covers the first conductive layer and form a pattern of a second conductive layer disposed on the third insulating layer, wherein the pattern of the second conductive layer at least includes: a first initial signal line 31, a second initial signal line 32, a second electrode plate 33 and a shield electrode 34, as shown in FIG. 12a and FIG. 12b, and FIG. 12b is a planar schematic diagram of the second conductive layer in FIG. 12a. In an exemplary embodiment, the second conductive layer may be referred to as a second metal gate layer (GATE 2).

As shown in FIG. 10 to FIG. 12b, body portions of the first initial signal line 31 and second initial signal line 32 may extend along the first direction X, the first initial signal line 31 in the M-th circuit unit row may be located between the first scan signal line 21 and the second scan signal line 22 of the present circuit unit, and the second initial signal line 32 may be located at a side of the second scan signal line 22 of the present circuit unit away from the first scan signal line 21. The second electrode plate 33 serves as the other plate of the storage capacitor and is located between the first scan signal line 21 and the light emitting control line 23 of the present circuit unit. A shield electrode 34 is located between the first scan signal line 21 (excluding a body portion of the gate block 21-1) and the second initial signal line 32 of present the circuit unit. The shield electrode 34 is configured to shield an influence of a data voltage jump on a key node, prevent the data voltage jump from affecting a potential of the key node of the pixel drive circuit, and improve a display effect.

In an exemplary embodiment, a profile of second electrode plate 33 may be in the shape of a rectangle, corners of which in shape of the rectangle may be provided with a chamfer. There is an overlapped region between an orthographic projection of the second electrode plate 33 on the substrate and an orthographic projection of the first electrode plate 24 on the substrate, the first electrode plate 24 and the second electrode plate 33 form the storage capacitor of the pixel drive circuit. The second electrode plate 33 is provided with an opening 35, and the opening 35 may be located in the middle of the second electrode plate 33. The opening 35 may be rectangular, and the second electrode plate 33 forms an annular structure. The opening 35 exposes the third insulating layer covering the first electrode plate 24, and the orthographic projection of the first electrode plate 24 on the substrate contains an orthographic projection of the opening 35 on the substrate. In an exemplary embodiment, the opening 35 is configured to accommodate a first via subsequently formed, which is located in the opening 35 and exposes the first electrode plate 24, so that a second electrode of the first transistor T1 subsequently formed is connected with the first electrode plate 24.

In an exemplary embodiment, the second electrode plates 33 of adjacent circuit units in the first direction X or the opposite direction of the first direction X may be connected through a plate connection line, a first end of the plate connection line 33 is connected with the second electrode plate 33 of the present sub-pixel, and a second end of the plate connection line 33 extends along the first direction X or the opposite direction of the first direction X and is connected with the second electrode plate 33 of the adjacent sub-pixel, that is, the plate connection line 33 is configured to allow the second electrode plates 33 of the adjacent circuit units in one circuit unit row to be connected with each other. In an exemplary embodiment, the second electrode plates of a plurality of circuit units in one circuit unit row form an integrated structure connected with each other through the plate connection line 35, and the second electrode plates with the integrated structure may be reused as a power supply signal connection line, thus ensuring that a plurality of second electrode plates in one circuit unit row have a same potential, which is beneficial to improving uniformity of the panel, avoiding a poor display of the display substrate and ensuring a display effect of the display substrate.

Figure 13A:
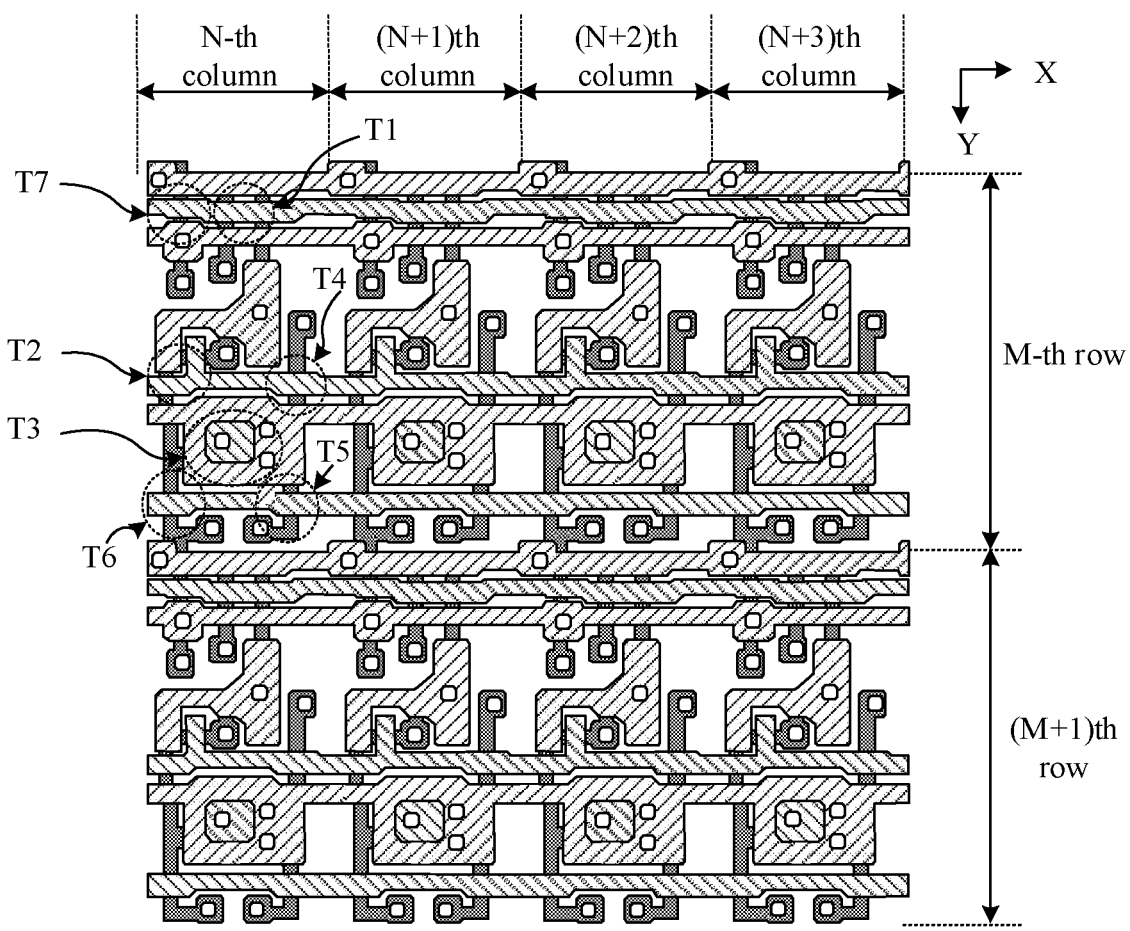
FIG. 13a is a schematic diagram of a display substrate after a pattern of a fourth insulating layer is formed according to the present disclosure.
Figure 13B:
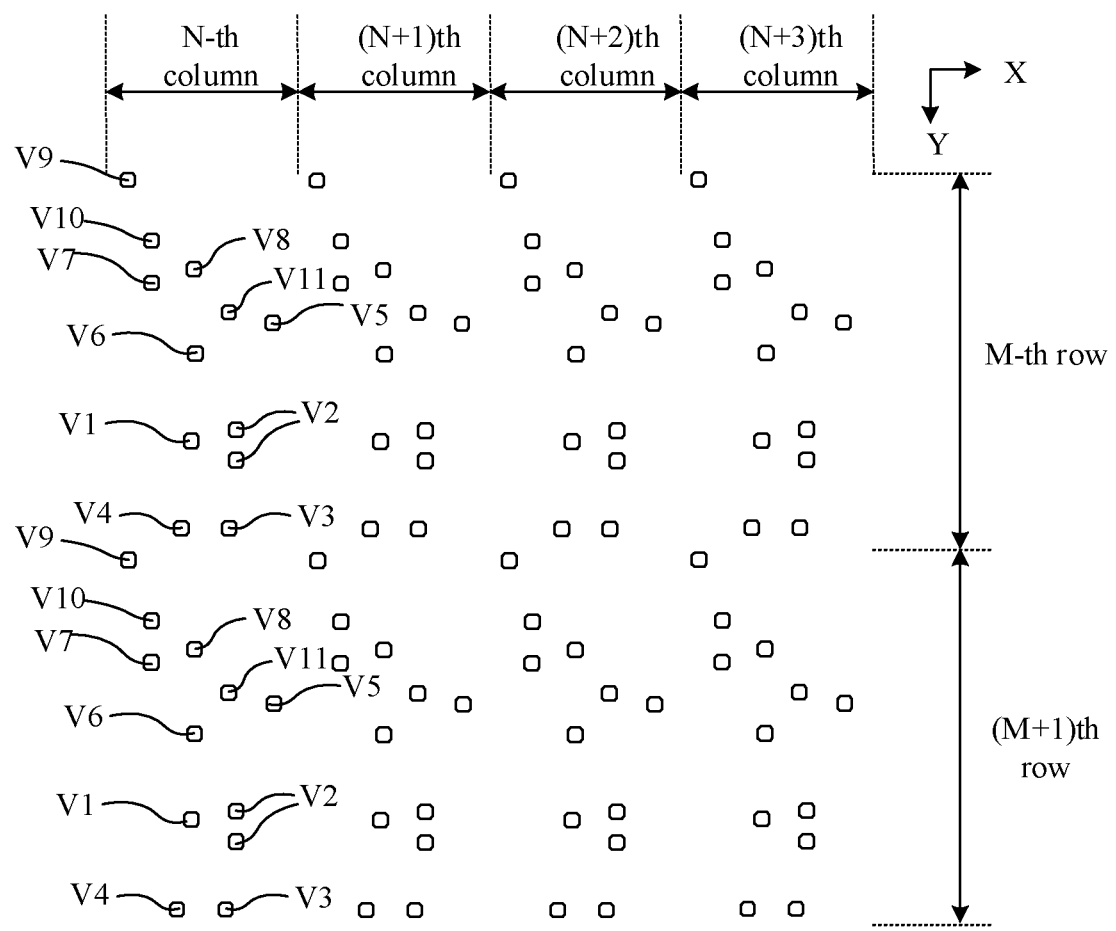

(4) Forming a pattern of a fourth insulating layer. In an exemplary embodiment, forming a pattern of a fourth insulating layer may include: depositing a fourth insulating thin film on the substrate on which the above-mentioned patterns are formed, and patterning the fourth insulating thin film through a patterning process to form a fourth insulating layer that covers the second conductive layer, wherein each circuit unit is provided with a plurality of vias, which at least include: a first via V1, a second via V2, a third via V3, a fourth via V4, a fifth via V5, a sixth via V6, a seventh via V7, an eighth via V8, a ninth via V9, a tenth via V10 and a eleventh via V11, as shown in FIG. 13a and FIG. 13b, and FIG. 13b is a planar schematic diagram of a plurality of vias in FIG. 13a.

As shown in conjunction with FIG. 10 to FIG. 13b, an orthographic projection of the first via V1 on the substrate is located within a range of the orthographic projection of the opening 35 of the second electrode plate 33 on the substrate. The fourth insulation layer and the third insulation layer in the first via V1 are etched away to expose a surface of the first electrode plate 24. The first via V1 is configured such that the second electrode of the first transistor T1 formed subsequently is connected with the first electrode plate 24 through the via.

In an exemplary embodiment, an orthographic projection of the second via V2 on the substrate is located within a range of the orthographic projection of the second electrode plate 33 on the substrate. The fourth insulating layer in the second via V2 is etched away to expose a surface of the second electrode plate 33. The second via V2 is configured such that the first power supply line formed subsequently is connected with the second electrode plate 33 through the via. In an exemplary embodiment, the second via V2 served as a power supply via may be plural, and the plurality of second vias V2 may be sequentially arranged along the second direction Y, thereby increasing the connection reliability between the first power supply line and the second electrode plate 33.

In an exemplary embodiment, an orthographic projection of the third via V3 on the substrate is located within a range of an orthographic projection of the fifth insulating layer on the substrate. The fourth insulating layer, the third insulating layer and the second insulating layer in the third via V3 is etched away to expose a surface of the first region of the fifth active layer. The third via V3 is configured such that the first power supply line formed subsequently is connected with the fifth active layer through the via.

In an exemplary embodiment, an orthographic projection of the fourth via V4 is located within a range of an orthographic projection of the sixth active layer. The fourth insulating layer, the third insulating layer, and the second insulating layer in the fourth via V4 are etched away to expose a surface of the second region of the sixth active layer (which is also the second region of the seventh active layer). The fourth via V4 is configured such that a second electrode of the sixth transistor T6 subsequently formed is connected with the sixth active layer through the via and a second electrode of the seventh transistor T7 subsequently formed is connected with the seventh active layer through the via.

In an exemplary embodiment, an orthographic projection of the fifth via V5 on the substrate is located within a range of an orthographic projection of the fourth active layer on the substrate. The fourth insulating layer, the third insulating layer and the second insulating layer in the fifth via V5 is etched away to expose a surface of the first region of the fourth active layer. The fifth via V5 is configured such that a data signal line formed subsequently is connected with the fourth active layer through the via, here the fifth via V5 is referred to as a data writing hole.

In an exemplary embodiment, an orthographic projection of the sixth via V6 on the substrate is located within a range of the orthographic projection of the second active layer on the substrate. The fourth insulating layer, the third insulating layer, and the second insulating layer in the sixth via V6 are etched away to expose a surface of the first region of the second active layer (which is also the second region of the first active layer). The sixth via V6 is configured such that a second electrode of the first transistor T1 subsequently formed is connected with the first active layer through the via and a first electrode of the second transistor T2 subsequently formed is connected with the second active layer through the via.

In an exemplary embodiment, an orthographic projection of the seventh via V7 on the substrate is located within a range of an orthographic projection of the seventh active layer on the substrate. The fourth insulating layer, the third insulating layer and the second insulating layer in the seventh via V7 is etched away to expose a surface of the first region of the seventh active layer. The seventh via V7 is configured such that a first electrode of the seventh transistor T7 subsequently formed is connected with the seventh active layer through the via.

In an exemplary embodiment, an orthographic projection of the eighth via V8 on the substrate is located within a range of an orthographic projection of the first insulating layer on the substrate. The fourth insulating layer, the third insulating layer and the second insulating layer in the eighth via V8 is etched away to expose a surface of the first region of the first active layer. The eighth via V8 is configured such that a first electrode of the first transistor T1 subsequently formed is connected with the first active layer through the via.

In an exemplary embodiment, an orthographic projection of the ninth via V9 on the substrate is located within a range of the orthographic projection of the first initial signal line 31 on the substrate. The fourth insulating layer in the ninth via V9 is etched away to expose a surface of the first initial signal line 31. The ninth via V9 is configured such that a first electrode of the first transistor T1 subsequently formed is connected with the first initial signal line 31 through the via.

In an exemplary embodiment, an orthographic projection of the tenth via V10 on the substrate is located within a range of the orthographic projection of the second initial signal line 32 on the substrate. The fourth insulating layer in the tenth via V10 is etched away to expose a surface of the second initial signal line 32. The tenth via V10 is configured such that a first electrode of the seventh transistor T7 subsequently formed is connected with the second initial signal line 32 through the via.

In an exemplary embodiment, an orthographic projection of the eleventh via V11 on the substrate is located within a range of an orthographic projection of the shield electrode 34 on the substrate. The fourth insulating layer in the eleventh via V11 is etched away to expose a surface of the shield electrode 34. The eleventh via V11 is configured such that the first power supply line formed subsequently is connected with the shield electrode 34 through the via.

Figure 14A:
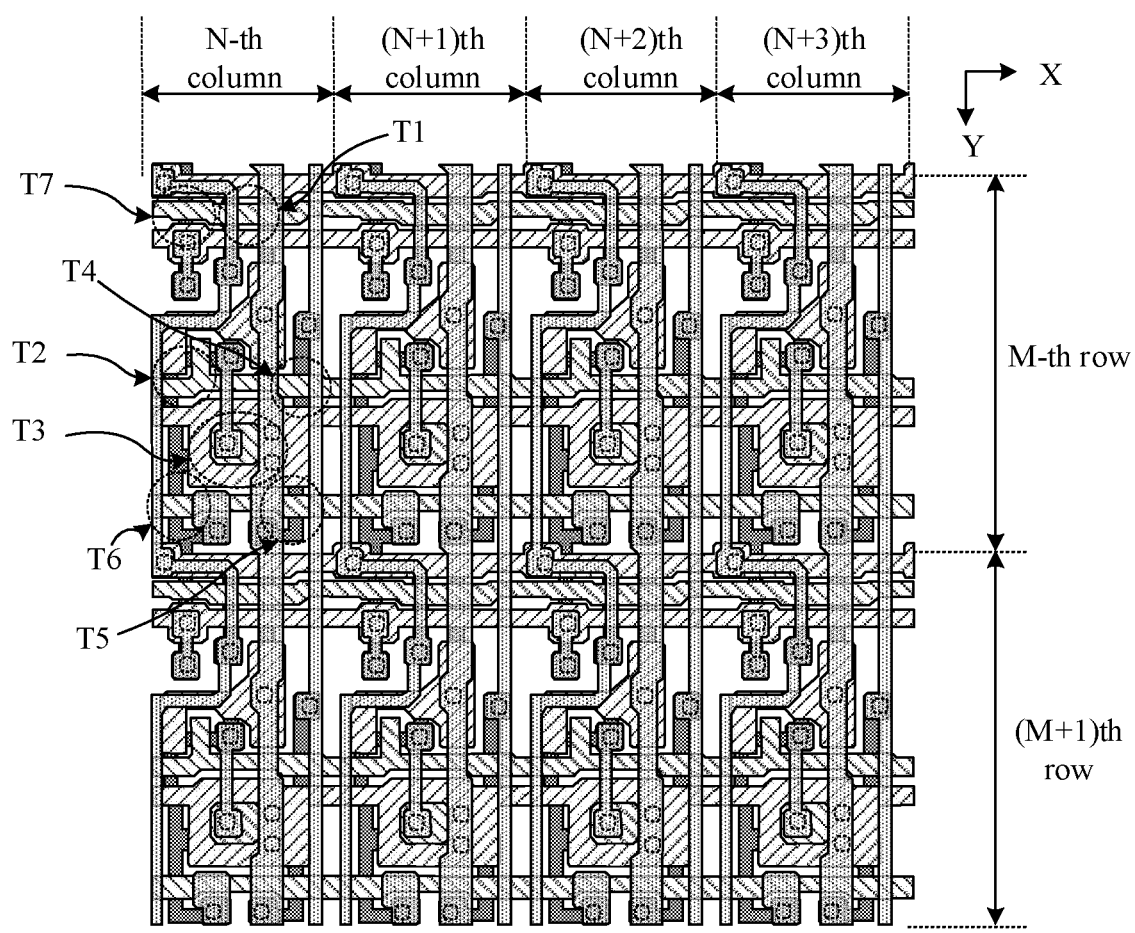
FIG. 14a is a schematic diagram of a display substrate after a pattern of a third conductive layer is formed according to the present disclosure.
Figure 14B:
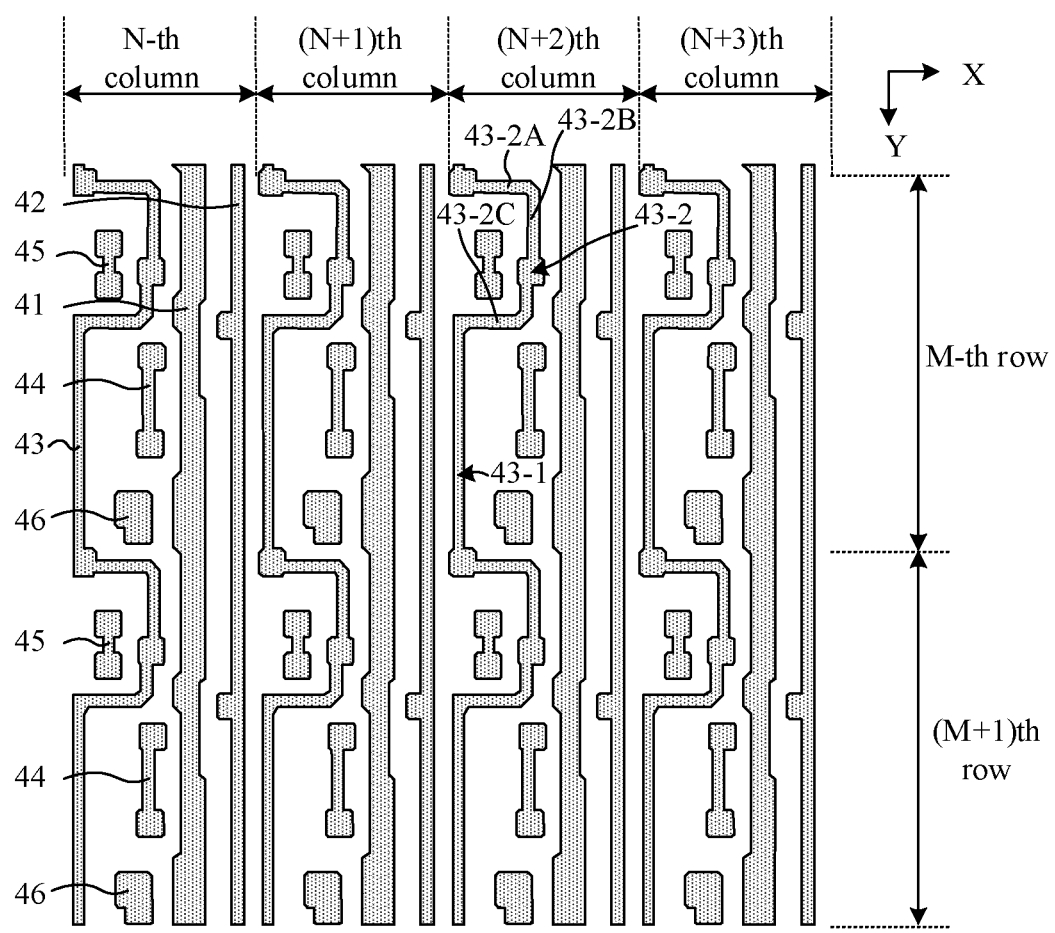

(5) Forming a pattern of a third conductive layer. In an exemplary embodiment, forming a pattern of a third conductive layer may include: depositing a third conductive thin film on the substrate on which the above-mentioned patterns are formed, and patterning the third conductive thin film through a patterning process to form a third conductive layer disposed on the fourth insulating layer, wherein the third conductive layer at least includes a first power supply line 41, a data signal line 42, an initial signal connection line 43, a first connection electrode 44, a second connection electrode 45, and a third connection electrode 46, as shown in FIG. 14a and FIG. 14b, and FIG. 14b is a planar schematic diagram of the third conductive layer in FIG. 14a. In an exemplary embodiment, the third conductive layer may be referred to as a first source-drain metal layer (SD1).

As shown in conjunction with FIG. 10 to FIG. 14b, a body portion of the first power supply line 41 extends in the second direction Y. On the one hand, the first power supply line 41 is connected with the second electrode plate 33 through the second via V2, and on the other hand, the first power supply line 41 is connected with the fifth active layer through the third via V3, and furthermore, is connected with the shield electrode 34 through the eleventh via V11, so that the shield electrode 34 and the second electrode plate 33 have a same potential as the first power supply line 41. Because the shield electrode 34 is connected with the first power supply line 41, and at least a partial region of the shield electrode 34 (such as a vertical portion at the right side of the shield electrode 34) is located between the first connection electrode 44 (which is a second electrode of the first transistor T1 and a first electrode of the second transistor T2, i.e. the second node N2) and the data signal line 42, the influence of data voltage jump on the key node of the pixel drive circuit is effectively shielded, the influence of data voltage jump on the potential of the key node of the pixel drive circuit is avoided, and the display effect is improved.

In an exemplary embodiment, a body portion of the data signal line 42 extends along the second direction Y, and the data signal line 42 is connected with the first region of the fourth active layer through the fifth via V5, so that a data signal is transmitted into the fourth transistor T4 by the data signal line 42.

In an exemplary embodiment, the initial signal connection line 43 may be in a zigzag shape of which a body portion extending along the second direction Y. In each circuit unit, on one hand, the initial signal connection line 43 is connected with the first initial signal line 31 through the ninth via V9, on the other hand, the initial signal connection line 43 is connected with the first region of the first active layer through the eighth via V8., and the initial signal connection line 43 may serve as the first electrode of the first transistor T1, thereby implementing that the first initial signal line 31 transmits a first initial signal into the first transistor T1.

In an exemplary embodiment, the initial signal connection line 43 may include a first line segment 43-1 which may be a straight line segment extending along the second direction Y and a second line segment 43-2 which may be a zigzag line segment, the first line segment 43-1 and the second line segment 43-2 are connected with each other.

In an exemplary embodiment, the second line segment 43-2 may include a first sub-line segment 43-2A and a third sub-line segment 43-2C of which body portions extend along the first direction X, and a second sub-line segment 43-2B of which a body portion extends along the second direction Y. In one circuit unit column, a first end of the first sub-segment 43-2A of the M-th circuit unit is connected with the first segment 43-1 of the (M−1)th circuit unit, a second end extends along the first direction X, and sequentially is connected with a first end of the second sub-line segment 43-2B; a second end of the second sub-line segment 43-2B extends along the second direction Y, and sequentially is connected with a first end of the third sub-line segment 43-2C; a second end of the third sub-line segment 43-2C extends along an opposite direction of the first direction X, and sequentially is connected with the first line segment 43-1 of present the circuit unit.

In an exemplary embodiment, the initial signal connection line 43 of the M-th circuit unit row in each circuit unit column and the initial signal connection line 43 of the (M+1)th circuit unit row are connected with each other, i.e. the initial signal connection lines 43 of adjacent circuit units in each circuit unit column form an integrated structure connected with each other. Because the initial signal connection line 43 is connected with the first initial signal line 31 through the ninth via V9, the initial signal connection line 43 with the integrated structure can be reused as a vertical initial signal line, and the first initial signal line 31 extending along the first direction X and the initial signal connection line 43 of which a body portion extends along the second direction Y form a grid shape. In the present disclosure, the initial signal connection line is disposed to be connected with the first initial signal line, so that the first initial signal lines form a network structure, a plurality of first initial signal lines 31 in a plurality of circuit unit rows and a plurality of circuit unit columns have a same potential. Therefore, not only a resistance of the first initial signal line is effectively reduced, a voltage drop of the first initial voltage is reduced, but also a uniformity of the first initial voltage in the display substrate is effectively improved, a display uniformity is effectively improved, and a display character and a display quality are improved.

In an exemplary embodiment, there is an overlapped region between the orthographic projection of the initial signal connection line 43 on the substrate and the orthographic projection of the shield electrode 34 on the substrate.

In an exemplary embodiment, the first connection electrode 44 may have a straight line shape extending along the second direction Y. A first end of the first connection electrode is connected with the second region of the first active layer (which is also the first region of the second active layer) through the sixth via V6, and a second end of the first connection electrode is connected with the first electrode plate 24 through the first via V1, so that the first electrode plate 24, the second electrode of the first transistor T1 and the first electrode of the second transistor T2 have a same potential. In an exemplary embodiment, the first connection electrode 44 may be used as the second electrode of the first transistor T1 and the first electrode of the second transistor T2.

In an exemplary embodiment, the second connection electrode 45 may have a straight line shape extending along the second direction Y, a first end thereof is connected with the second initial signal line 32 through the tenth via V10, and a second end thereof is connected with the first region of the seventh active layer through the seventh via V7. The second connection electrode 45 may serve as a first electrode of the seventh transistor T7, thereby implementing that the second initial signal line 32 transmits a second initial signal into the seventh transistor T7.

In an exemplary embodiment, the third connection electrode 46 is connected with the second region of the sixth active layer (which is also the second region of the seventh active layer) through the fourth via V4, so that the second electrode of the sixth transistor T6 and the second electrode of the seventh transistor T7 have a same potential. In an exemplary embodiment, the third connection electrode 46 may be used as the second electrode of the sixth transistor T6 and the second electrode of the seventh transistor T7. In an exemplary embodiment, the third connection electrode 46 is configured to be connected with an first anode connection electrode subsequently formed.

In an exemplary embodiment, the first power supply lines 41 of each circuit unit may be of an unequal width design, and the first power supply lines 41 adopting the unequal width design may not only facilitate a layout of the pixel structure, but also reduce a parasitic capacitance between the first power supply line and the data signal line.

In an exemplary embodiment, shapes of the first power supply line 41, the data signal line 42, the initial signal connection line 43, the first connection electrode 44, the second connection electrode 45, and the third connection electrode 46 of the respective circuit units may be same or may be different, which is not limited in the present disclosure.

Figure 15A:
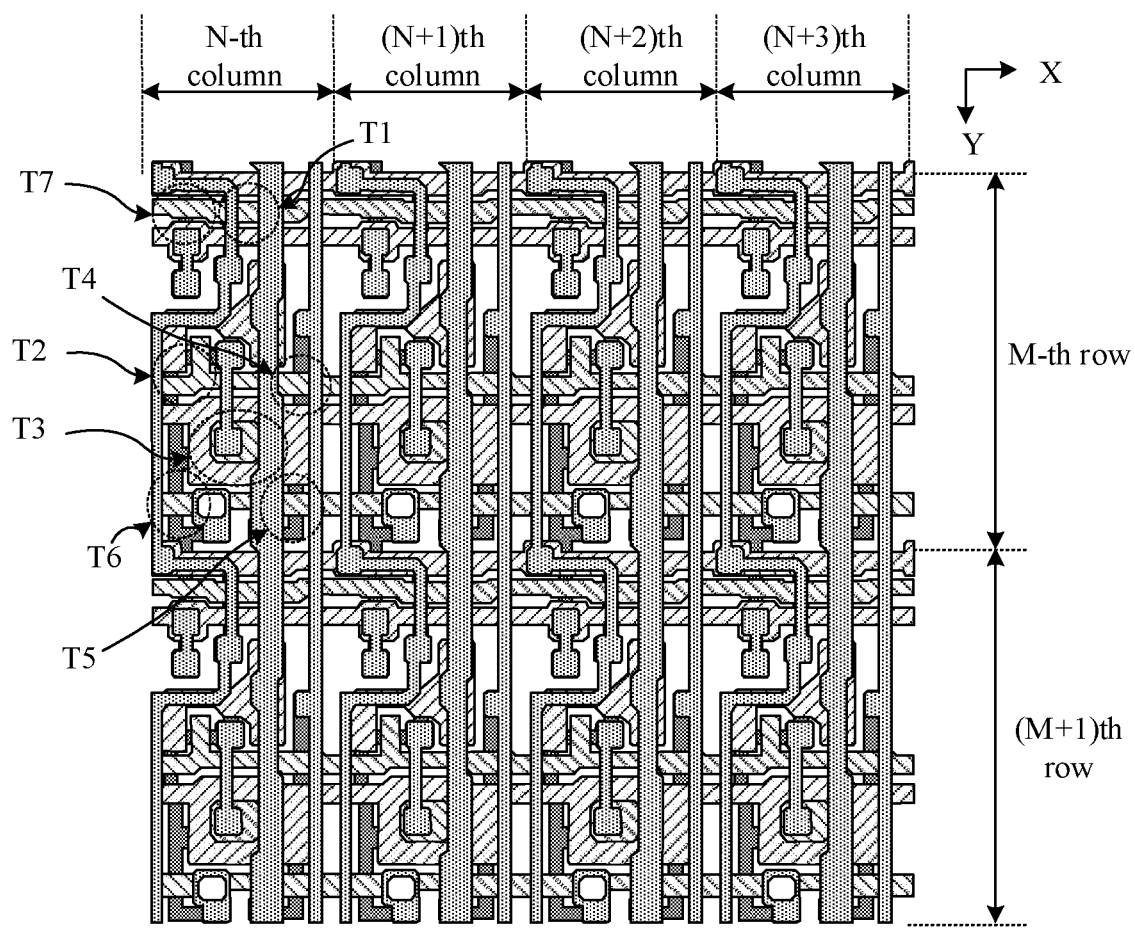
FIG. 15a is a schematic diagram of a display substrate after a pattern of a fifth insulating layer is formed according to the present disclosure.
Figure 15B:
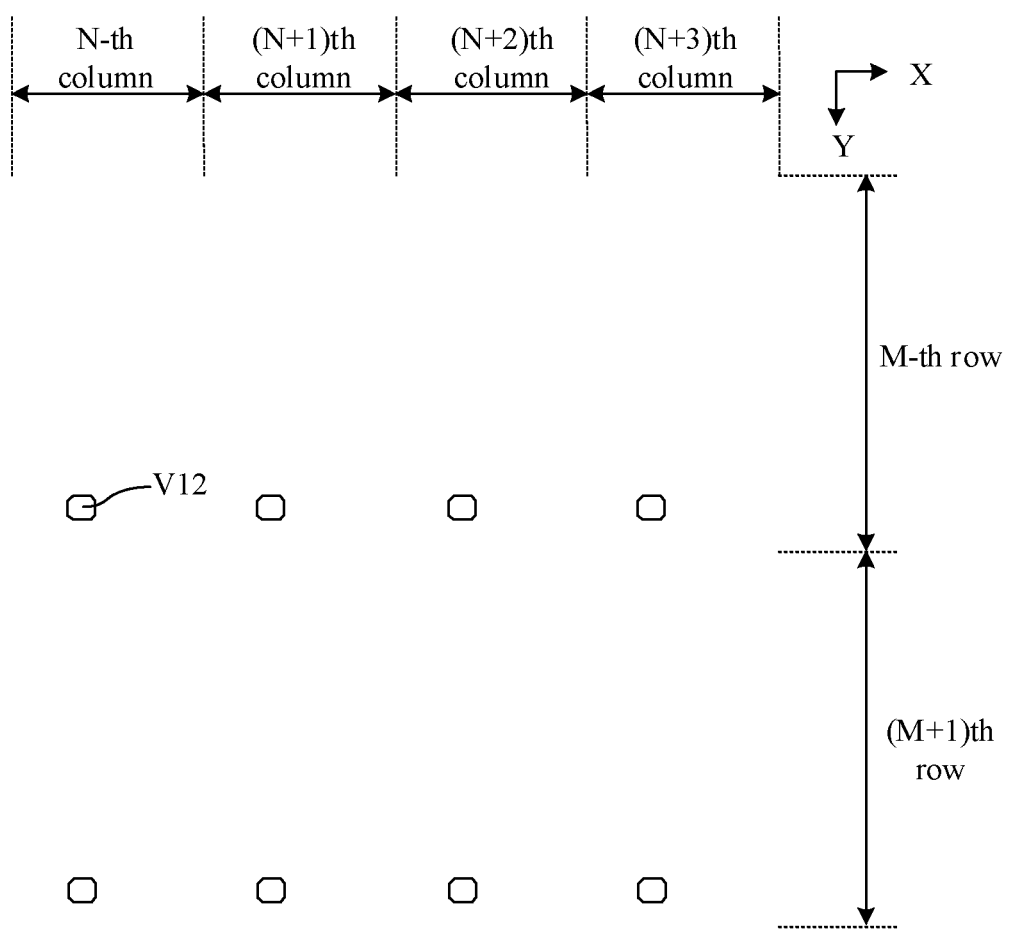

(6) Forming a pattern of a fifth insulating layer. In an exemplary embodiment, forming a pattern of a fifth insulating layer may include: depositing a fifth insulating film on the substrate on which the above-mentioned patterns are formed, and patterning the fifth insulating thin film through a patterning process to form a fifth insulating layer covering the third conductive layer, wherein the fifth insulating layer is provided with a plurality of vias, and the plurality of vias at least include a twelfth via V12, as shown in FIG. 15a and FIG. 15b, and FIG. 15b is a planar schematic diagram of the plurality of vias in FIG. 15a.

As shown in conjunction with FIG. 10 to FIG. 15b, an orthographic projection of the twelfth via V12 on the substrate is located within a range of an orthographic projection of the third connection electrode 46 on the substrate, the fifth insulating layer in the twelfth via V12 is removed to expose a surface of the third connection electrode 46, and the twelfth via V12 is configured such that a first anode connection electrode formed subsequently is connected with the third connection electrode 46 through the via.

In an exemplary embodiment, positions of the twelfth vias V12 in the respective circuit units may be the same or may be different, which is not limited in the present disclosure.

Figure 16A:
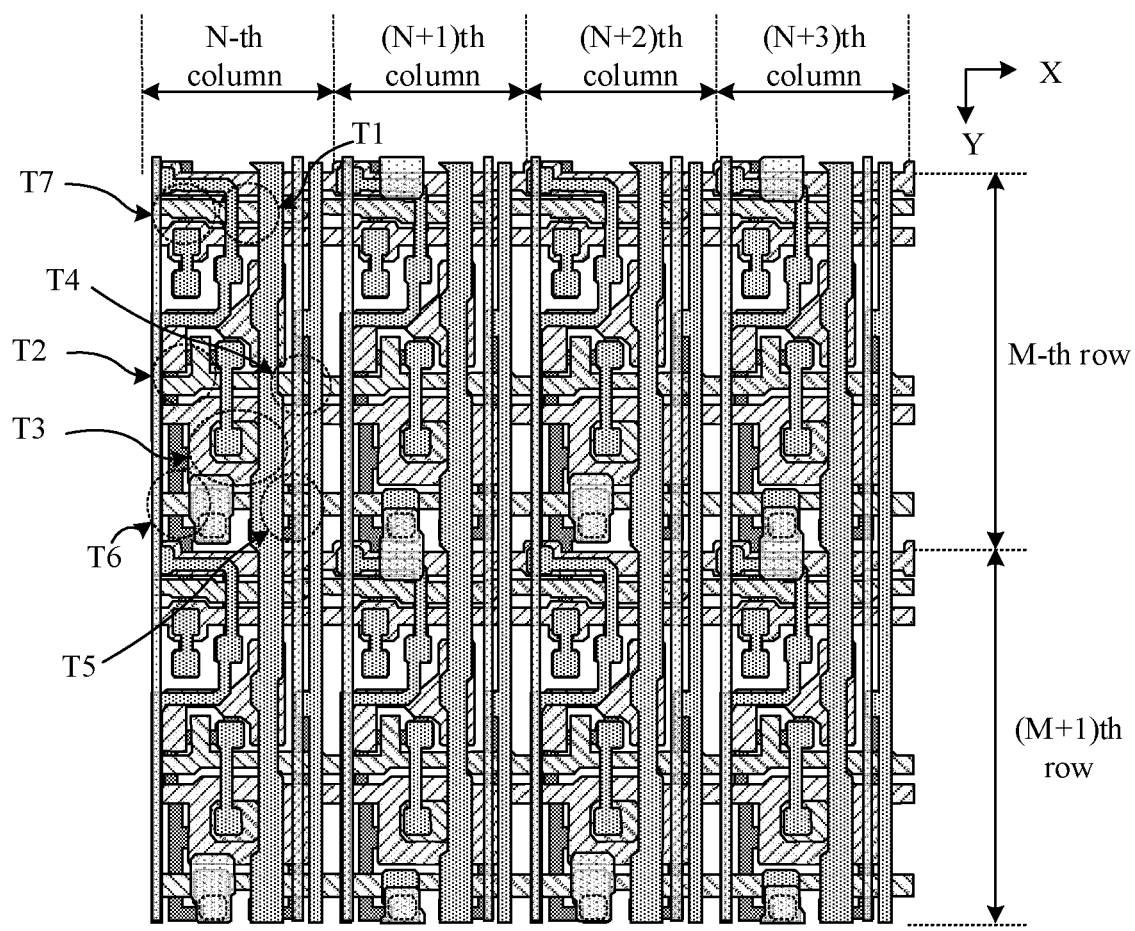
FIG. 16a is a schematic diagram of a display substrate after a pattern of a fourth conductive layer is formed according to the present disclosure.
Figure 16B:
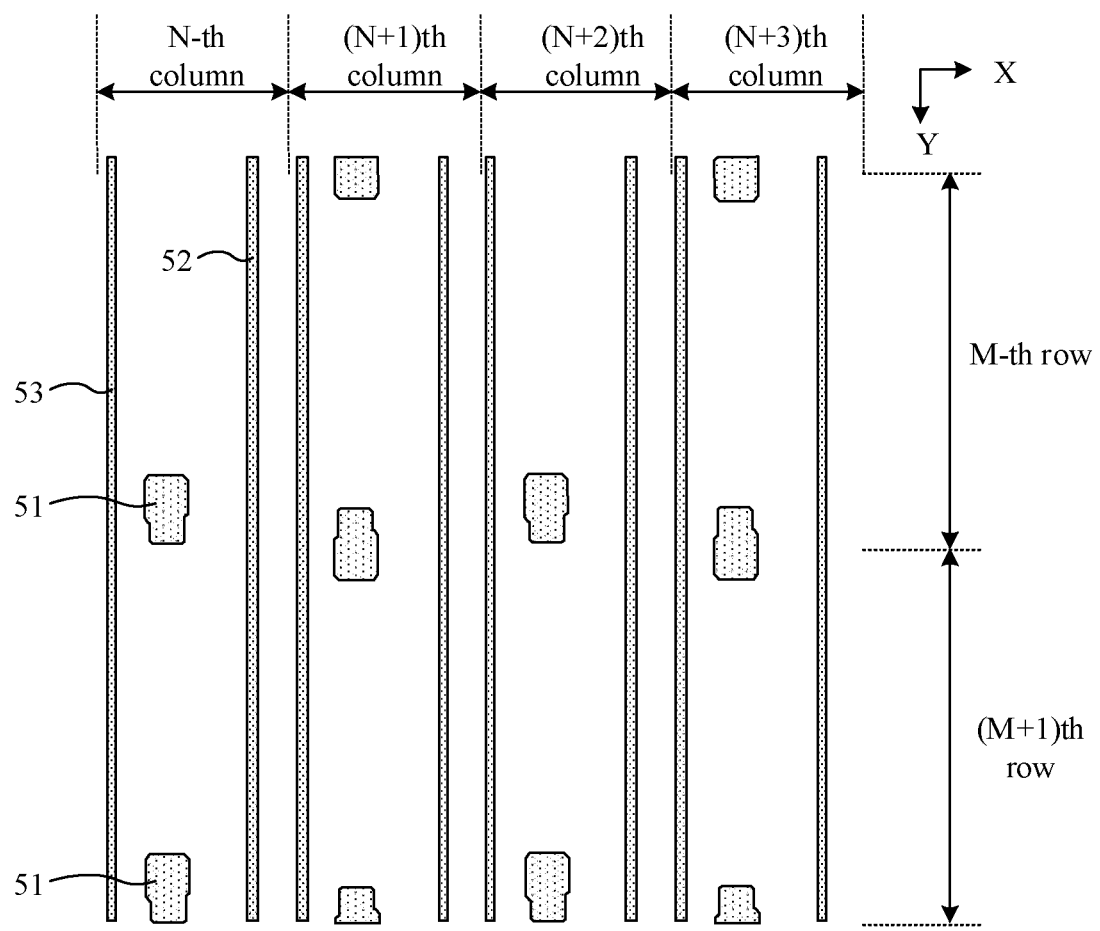

(7) Forming a pattern of a fourth conductive layer. In an exemplary embodiment, forming a pattern of a fourth conductive layer may include: depositing a fourth conductive thin film on the substrate on which the above-mentioned patterns are formed, and patterning the fourth conductive thin film through a patterning process to form a fourth conductive layer disposed on the fifth insulating layer, wherein the fourth conductive layer at least includes a first anode connection electrode 51, a first data fan-out line 52 and a second data fan-out line 53, as shown in FIG. 16 and FIG. 16b, and FIG. 16b is a planar schematic diagram of the fourth conductive layer in FIG. 16a. In an exemplary embodiment, the fourth conductive layer may be referred to as a second source-drain metal layer (SD2).

As shown in conjunction with FIG. 10 to FIG. 16b, in an exemplary embodiment, the first anode connection electrode 51 may be disposed in each circuit unit. The first anode connection electrode 51 is connected with the third connection electrode 46 through the twelfth via V12. Because the third connection electrode 46 is connected with the second region of the sixth active layer (also the second region of the seventh active layer) through the fourth via V4, the first anode connection electrode 51 is connected with the second region of the sixth active layer (also the second region of the seventh active layer) through the third connection electrode 46. In an exemplary embodiment, the first anode connection electrode 51 is configured to be connected with a second anode connection electrode subsequently formed.

In an exemplary embodiment, a shape of the first anode connection electrode in a N-th circuit unit column and a shape of the first anode connection electrode in a (N+2)th circuit unit column may be the same, a shape of the first anode connection electrode in a (N+1)th circuit unit column may be the same as a shape of the first anode connection electrode in a (N+3)th circuit unit column, and the shape of the first anode connection electrode may be rectangular.

In an exemplary embodiment, the first data fan-out line 52 and the second data fan-out line 53 may be in a straight line shape of which a body portion extends along the second direction Y. In each circuit unit, the first data fan-out line 52 is disposed between the first power supply line 41 and the data signal line 42. The orthographic projection of the first data fan-out line 52 on the substrate is not overlapped with the orthographic projection of the first power supply line 41 on the substrate, and the orthographic projection of the first data fan-out line 52 on the substrate is not overlapped with the orthographic projection of a body portion of the data signal line 42 on the substrate.

In a display substrate, the first data fan-out line is disposed above the first power supply line, i.e. the orthographic projection of the first data fan-out line on the substrate is located within a range of the orthographic projection of the first power supply line on the substrate. An research result indicates that the structure causes large parasitic capacitance between the first data fan-out line and the first power supply line, and the parasitic capacitance reaches more than 9 fF, which leads to large crosstalk. According to an exemplary embodiment of the present disclosure, the first data fan-out line is disposed between the first power supply line and the data signal line, and the first data fan-out line is not overlapped with the first power supply line and the data signal line, so that the first data fan-out line avoids the first power supply line, thus effectively reducing a parasitic capacitance between the first data fan-out line and the first power supply line, and effectively reducing crosstalk. The simulation result indicates that in the display substrate structure according to an exemplary embodiment of the present disclosure, the parasitic capacitance value between the first data fan-out line and the first power supply line may be reduced to less than 6 fF, and the crosstalk degree is reduced by 30%.

In the exemplary embodiment, the second data fan-out line 53 is disposed at a side of the first power supply line 41 away from the data signal line 42, and the orthographic projection of the second data fan-out line 53 on the substrate is at least partially overlapped with the orthographic projection of the first line segment of the initial signal connection line 43 on the substrate.

According to an exemplary embodiment of the present disclosure, the second data fan-out line is disposed in a region where the initial signal connection line is located, the orthographic projection of the second data fan-out line on the substrate is at least partially overlapped with the orthographic projection of the initial signal connection line on the substrate, so that the initial signal connection line of a normal pressure signal may shield a influence of a data voltage jump on the second data fan-out line to the pixel drive circuit, thus effectively reducing an influence of the data fan-out line to a potential of the key node in the pixel drive circuit, and improving the display effect.

In an exemplary embodiment, the circuit unit may include only the first data fan-out line 52; alternatively, the circuit unit may include only the second data fan-out line 53; alternatively, the circuit unit may include both the first data fan-out line 52 and the second data fan-out line 53, which is not limited in the present disclosure.

In an exemplary embodiment, the data fan-out line in the display substrate may include a third data fan-out line extending along the first direction X, the third data fan-out line may be connected with the first data fan-out line; alternatively, the third data fan-out line may be connected with the second data fan-out line; alternatively, one third data fan-out line is connected with the first data fan-out line, another third data fan-out line is connected with the second data fan-out line. The first data fan-out line, or the second data fan-out line, or the third data fan-out line may be connected with the data signal line through a via, which is not limited in the present disclosure.

Figure 17A:
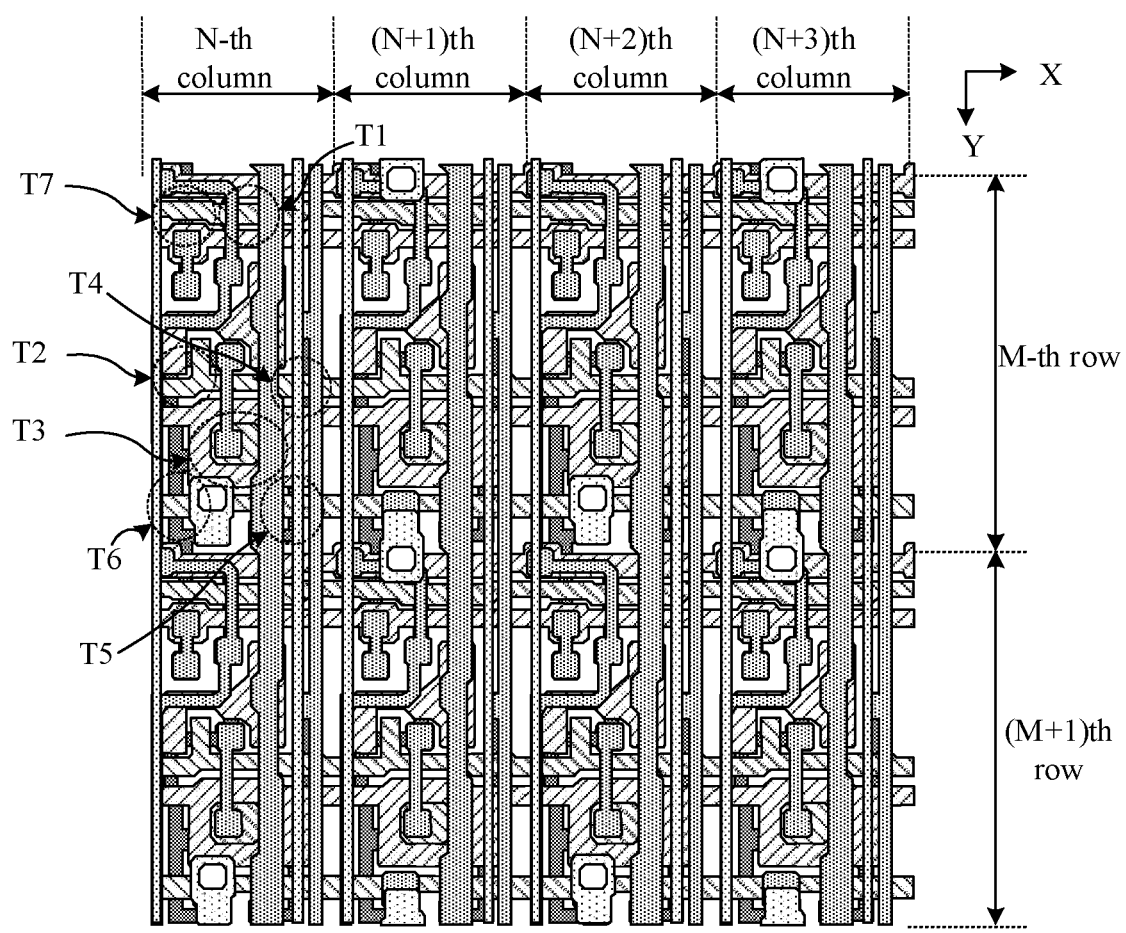
FIG. 17a is a schematic diagram of a display substrate after a pattern of a sixth insulating layer is formed according to the present disclosure.
Figure 17B:
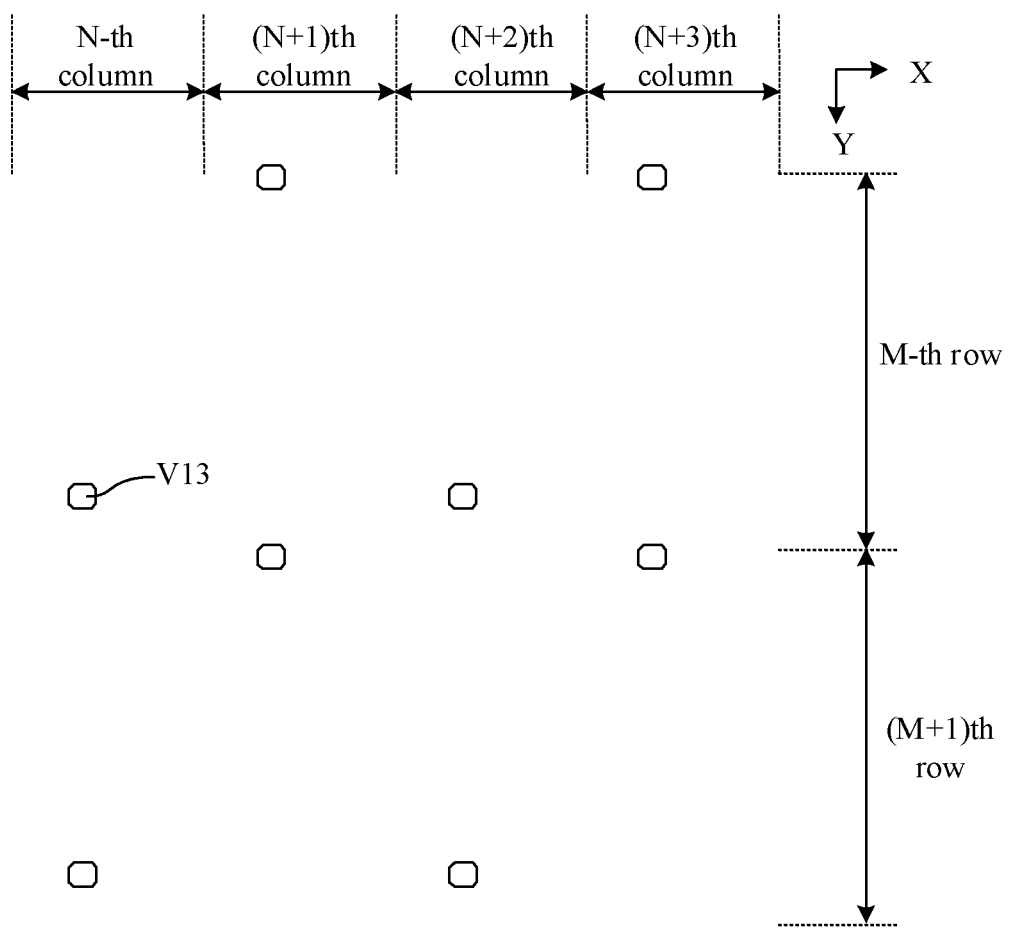

(8) Forming a pattern of a sixth insulating layer. In an exemplary embodiment, forming a pattern of a sixth insulating layer may include: depositing a sixth insulating film on the substrate on which the above-mentioned patterns are formed, and patterning the sixth insulating film through a patterning process to form a sixth insulating layer covering the fourth conductive layer, wherein the sixth insulating layer is provided with a thirteenth via V13, as shown in FIG. 17a and FIG. 17b, and FIG. 17b is a planar schematic diagram of the plurality of vias in FIG. 17a.

As shown in conjunction with FIG. 10 to FIG. 17b, an orthographic projection of the twelfth via V13 on the substrate is located within a range of an orthographic projection of the first anode connection electrode 51 on the substrate, the sixth insulating layer in the thirteenth via V13 is removed to expose a surface of the first anode connection electrode 51, and the thirteenth via V13 is configured such that the second anode connection electrode formed subsequently is connected with the first anode connection electrode 51 through the via.

In an exemplary embodiment, positions of the thirteenth vias V13 in the respective circuit units may be the same or may be different, which is not limited in the present disclosure.

Figure 18A:
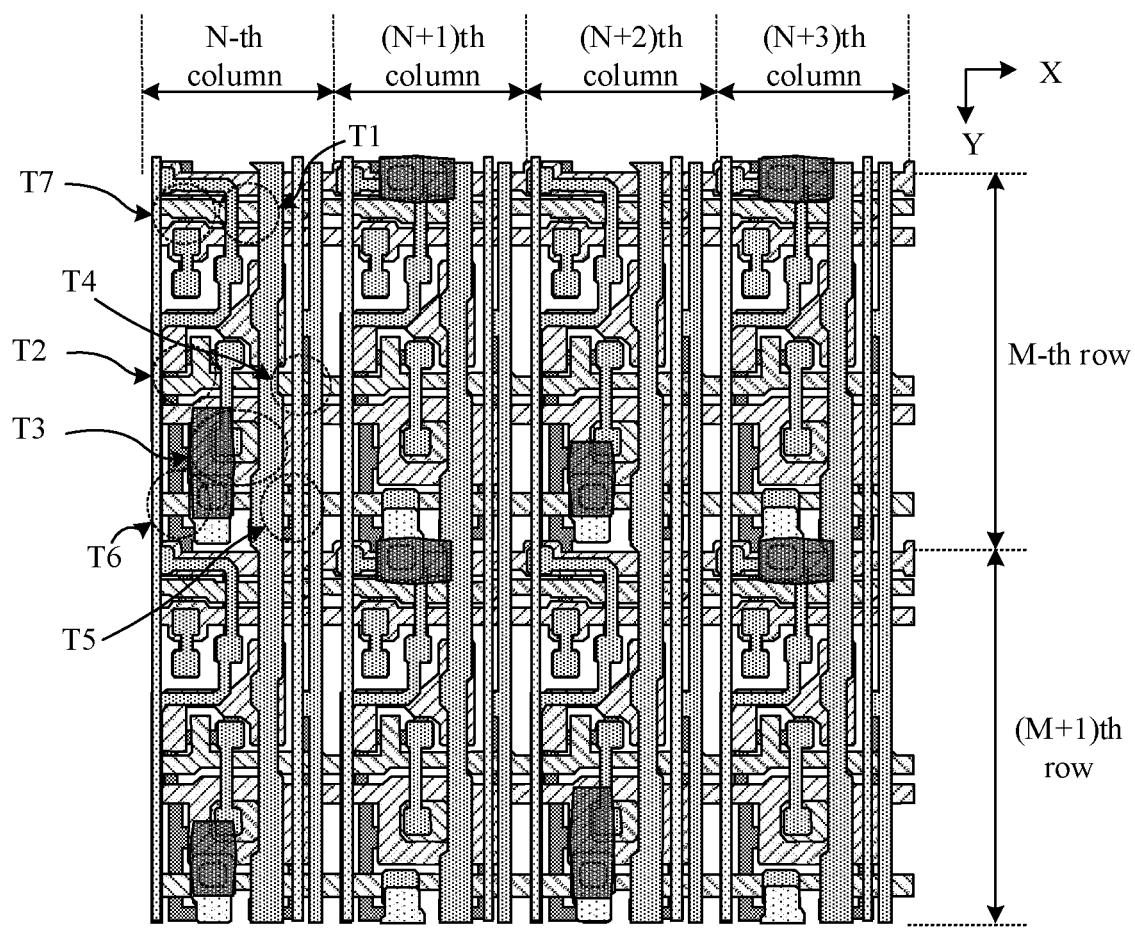
FIG. 18a is a schematic diagram of a display substrate after a pattern of a fifth conductive layer is formed according to the present disclosure.
Figure 18B:
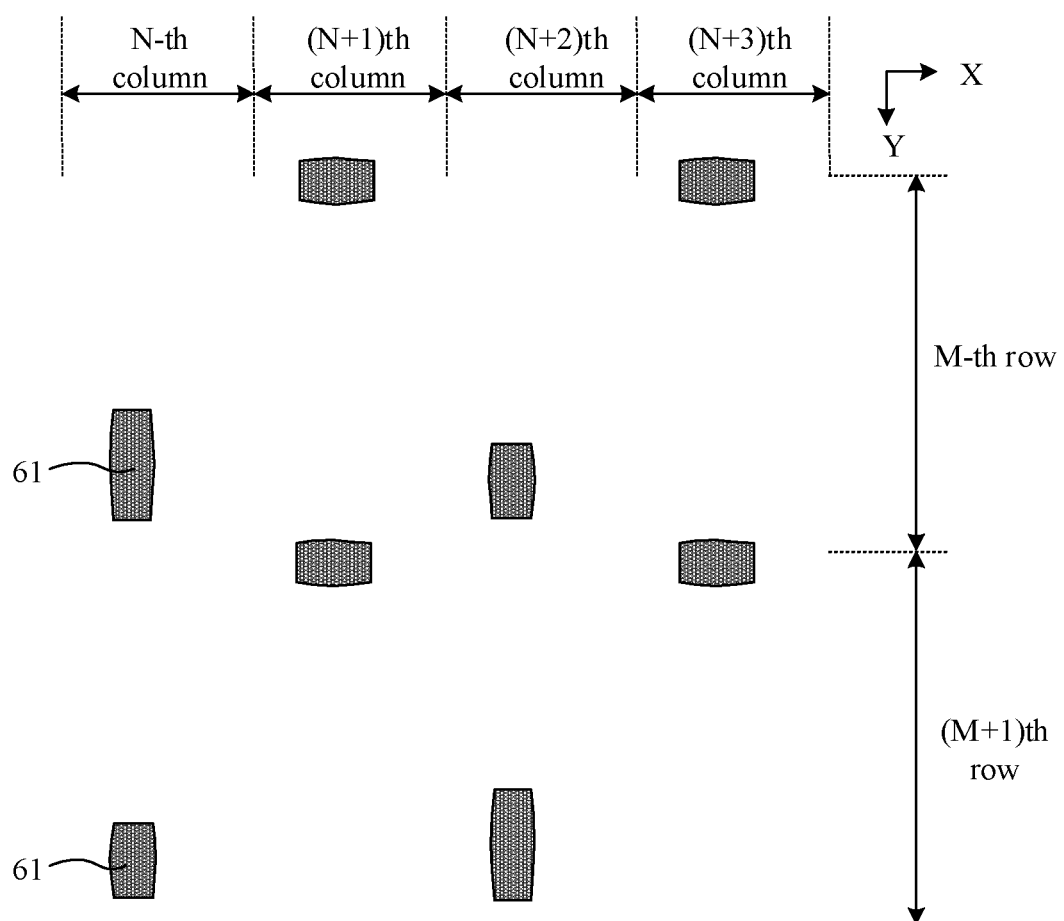

(9) Forming a pattern of a fifth conductive layer. In an exemplary embodiment, forming a pattern of a fifth conductive layer may include: depositing a fifth conductive thin film on the substrate on which the above-mentioned patterns are formed, and patterning the fifth conductive thin film through a patterning process to form a fifth conductive layer disposed on the sixth insulating layer, wherein the fifth conductive layer at least includes a second anode connection electrode 61, as shown in FIG. 18a and FIG. 18b, and FIG. 18b is a planar schematic diagram of the fifth conductive layer in FIG. 18a.

As shown in conjunction with FIG. 10 to FIG. 18b, in an exemplary embodiment, the second anode connection electrode 61 may be disposed in each circuit unit. The second anode connection electrode 61 is connected with the first anode connection electrode 51 through the thirteenth via V13. Because the first anode connection electrode 51 is connected with the third connection electrode 46 through the twelfth via V12, the third connection electrode 46 is connected with the second region of the sixth active layer (also the second region of the seventh active layer) through the fourth via V4, thereby achieving that the second anode connection electrode 61 is connected with the second region of the sixth active layer (also the second region of the seventh active layer) through the first anode connection electrode 51 and the third connection electrode 46. In an exemplary embodiment, the second anode connection electrode 61 is configured to be connected with an anode formed subsequently.

In an exemplary embodiment, a shape of the anode connection electrode in the circuit unit of the N-th column and the M-th row may be the same as a shape of the second anode connection electrode in circuit unit of the (N+2)th column and the (M+1)th row, a shape of the second anode connection electrode in the circuit unit of the N-th column and the the (M+1)th row may be the same as a shape of the second anode connection electrode in the circuit unit of (N+2)th column and the M-th row, a shape of the second anode connection electrode in the (N+1)th circuit unit column may be the same as a shape of the second anode connection electrode in the (N+3)th circuit unit column, and the shape of the second anode connection electrode may be rectangular.

Figure 19A:
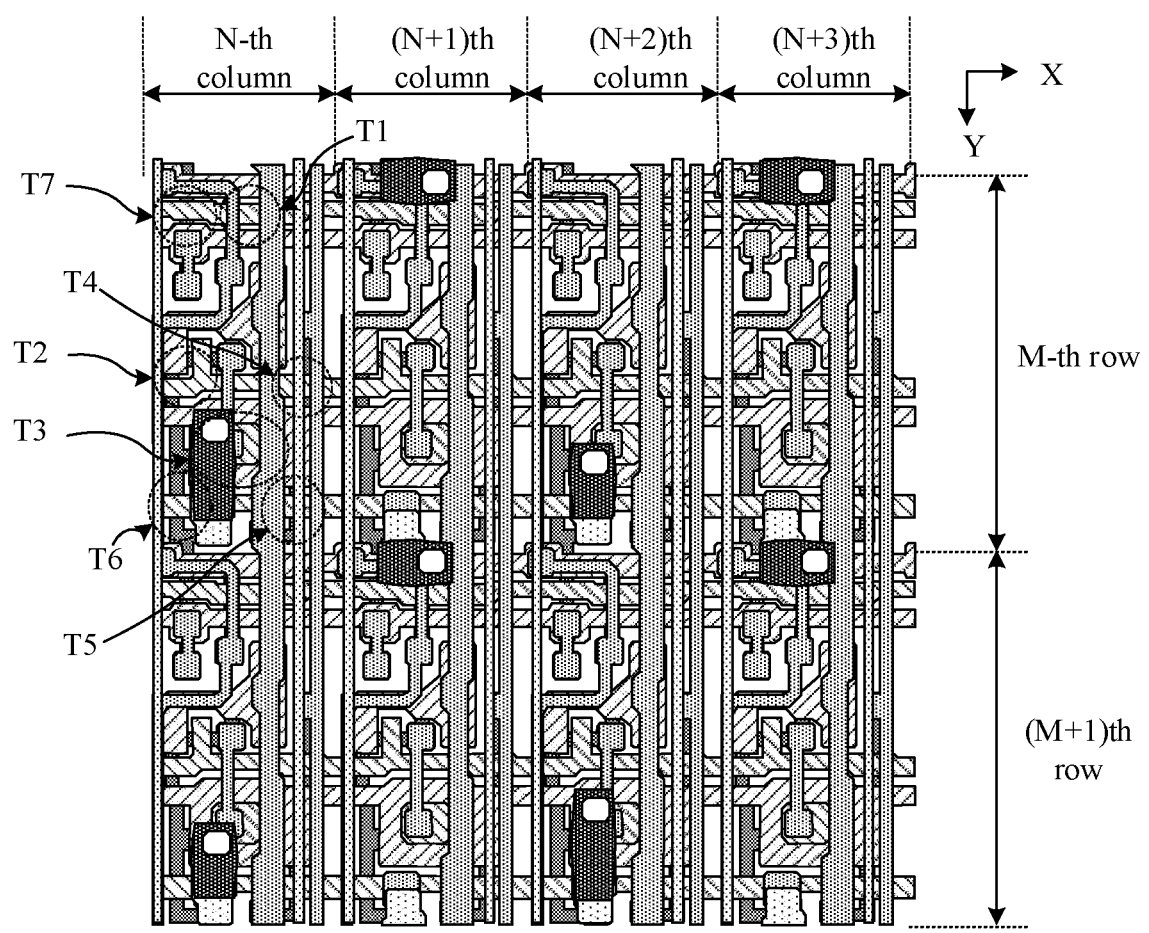
FIG. 19a is a schematic diagram of a display substrate after a pattern of a first planarization layer is formed according to the present disclosure.
Figure 19B:
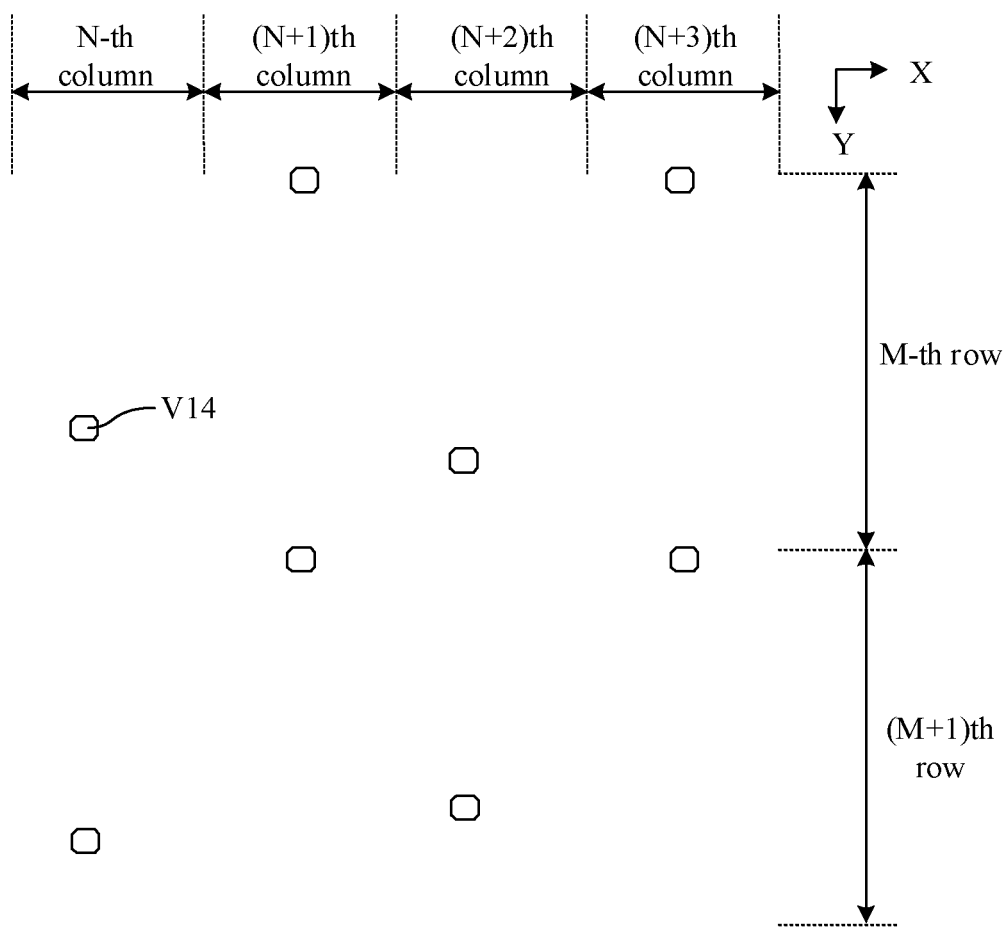

(10) Forming a pattern of a first planarization layer. In an exemplary embodiment, forming a pattern of a first planarization layer may include: coating a first planarization thin film on the substrate on which the above-mentioned patterns are formed, and patterning the planarization thin film through a patterning process to form a first planarization layer covering the fifth conductive layer, wherein the first planarization layer is provided with a plurality of vias, and the plurality of vias at least include a fourteenth via V14, as shown in FIG. 19a and FIG. 19b, and FIG. 19b is a planar schematic diagram of the plurality of vias in FIG. 19a.

As shown in conjunction with FIG. 10 to FIG. 19b, an orthographic projection of the fourteenth via V14 on the substrate is located within a range of an orthographic projection of the second anode connection electrode 61 on the substrate, the first planarization layer in the fourteenth via V14 is removed to expose a surface of the second anode connection electrode 61, and the fourteenth via V14 is configured such that the anode formed subsequently is connected with the second anode connection electrode 61 through the via.

So far, the drive circuit layer is prepared on the substrate. In a plane parallel to the display substrate, the drive circuit layer may include a plurality of circuit units, each of the circuits may include a pixel drive circuit, and a first scan signal line, a second scan signal line, a light emitting control line, a data signal line, a first power supply line, a first initial signal line, and a second initial signal line connected with the pixel drive circuit. In an exemplary embodiment, at least one circuit unit may include a first data fan-out line disposed between the first power supply line and the data signal line, and/or a second data fan-out line of which an orthographic projection on the substrate is at least partially overlapped with an orthographic projection of the initial signal connection line on the substrate. In a plane perpendicular to the display substrate, the drive circuit layer may include a first insulating layer, a semiconductor layer, a second insulating layer, a first conductive layer, a third insulating layer, a second conductive layer, a fourth insulating layer, a third conductive layer, a fifth insulating layer, a fourth conductive layer, a sixth insulating layer, a fifth conductive layer and a first planarization layer that are sequentially stacked on the substrate, the first data fan-out line and/or the second data fan-out line may be disposed in the fourth conductive layer.

In an exemplary embodiment, after the drive circuit layer is prepared, a light emitting structure layer is prepared on the driver circuit layer, and a preparation process of the light emitting structure layer may include the following operations.

Figure 20A:
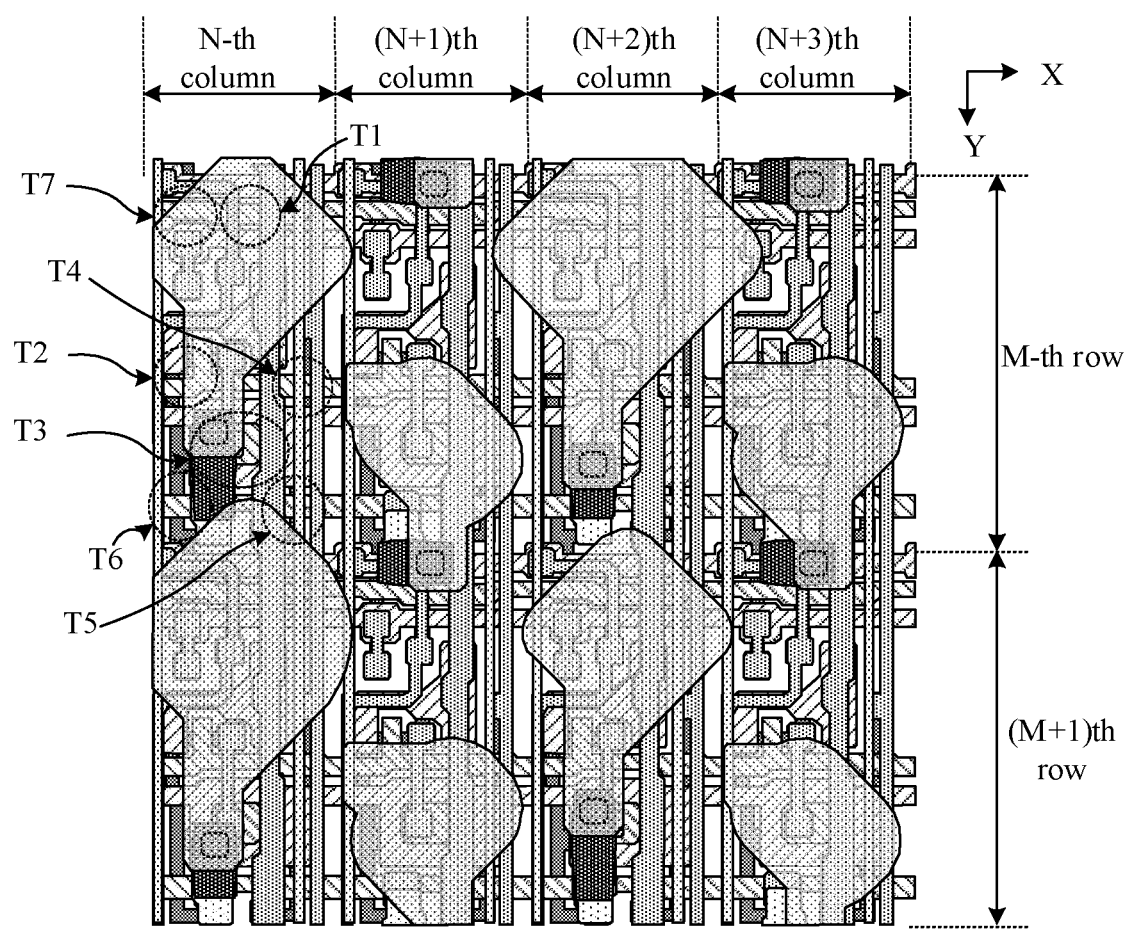
FIG. 20a is a schematic diagram of a display substrate after a pattern of an anode is formed according to the present disclosure.
Figure 20B:
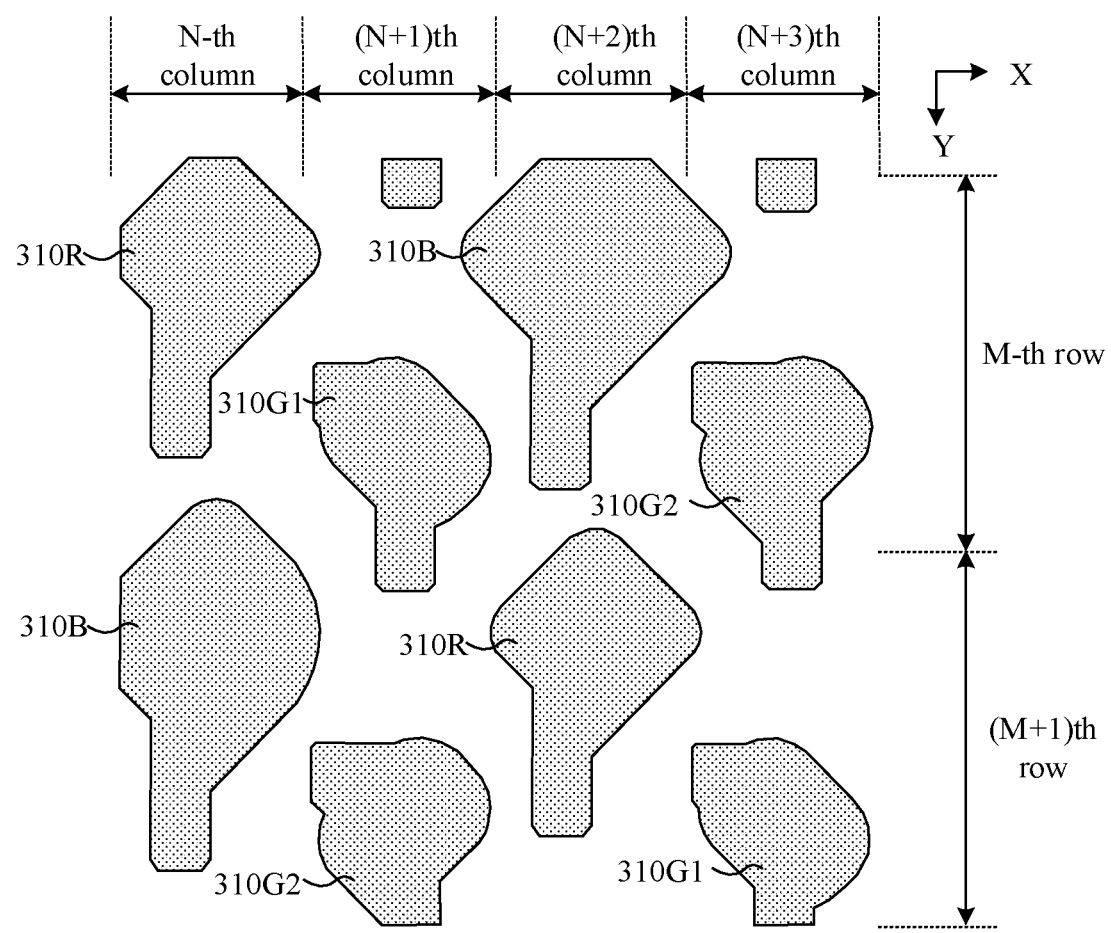

(11) Forming a pattern of an anode. In an exemplary embodiment, forming a pattern of an anode may include: depositing a sixth conductive thin film on the substrate on which the above-mentioned patterns are formed, and patterning the sixth conductive thin film through a patterning process to form a pattern of an anode disposed on the first planarization layer, the anode is arranged in a manner of square to form a GGRB pixel arrangement, as shown in FIG. 20a and FIG. 20b, and FIG. 20b is a planar schematic diagram of the anode in FIG. 20a.

As shown in conjunction with FIG. 10 to FIG. 20b, the pattern of the anode may include a red anode 301R of a red light emitting device, a blue anode 301B of a blue light emitting device, a first green anode 301G1 of a first green light emitting device, and a second green anode 301G2 of a second green light emitting device, a region where the red anode 301R is located may form a red sub-pixel R that emits red light, a region where the blue anode 301B is located may form a blue sub-pixel B that emits blue light, a region where the first green anode 301G1 is located may form a first green sub-pixel G1 that emits green light, a region where the second green anode 301G2 is located may form a second green sub-pixel G2 that emits green light, the red sub-pixel R and the blue sub-pixel B are sequentially arranged along the second direction Y, the first green sub-pixel G1 and the second green sub-pixel G2 are sequentially arranged along the second direction Y, the first green sub-pixel G1 and the second green sub-pixel G2 are respectively arranged at a side of the red sub-pixel R and the blue sub-pixel B in the first direction X, and the red sub-pixel R, the blue sub-pixel B, the first green sub-pixel G1 and the second green sub-pixel G2 form a square-arranged pixel unit.

In an exemplary embodiment, in one pixel unit, the red anode 301R, through the fourteenth via V14 in a circuit unit of the M-th row and the N-th column, is connected with the second anode connection electrode 61 in the circuit unit; the blue anode 301B, through the fourteenth via V14 in a circuit unit of the (M+1)th row and the N-th column, is connected with the second anode connection electrode 61 in the circuit unit; the first green anode 301G1, through the fourteenth via V14 in a circuit unit of the M-th row and the (N+1)th column, is connected with the second anode connection electrode 61 in the circuit unit; the second green anode 301G2, through the fourteenth via V14 in a circuit unit of the (M+1)th row and the (N+1)th column, is connected with the second anode connection electrode 61 in the circuit unit. In another pixel unit, the red anode 301R, through the fourteenth via V14 in a circuit unit of the (M+1)th row and the (N+2)th column, is connected with the second anode connection electrode 61 in the circuit unit; the blue anode 301B, through the fourteenth via V14 in a circuit unit in the M-th row and the (N+2)th column, is connected with the second anode connection electrode 61 in the circuit unit; the first green anode 301G1, through the fourteenth via V14 in a circuit unit of the (M+1)th row and (N+3)th column, is connected with the second anode connection electrode 61 in the circuit unit; the second green anode 301G2, through the fourteenth via V14 in a circuit unit of the M-th row and (N+3)th column, is connected with the second anode connection electrode 61 in the circuit unit.

In an exemplary embodiment, because each anode is connected with the second region of the sixth active layer (also the second region of the seventh active layer) through the second anode connection electrode, the first anode connection electrode and the third connection electrode 46 in one circuit unit, therefore, four anodes in one pixel unit are correspondingly connected with pixel drive circuits of four circuit units in one circuit unit group, respectively, so that the pixel drive circuit can drive the light emitting device to emit light.

In an exemplary embodiment, shapes and positions of two red anodes 301R respectively connected with pixel drive circuits in the circuit unit of M-th row and N-th column and the circuit unit of (M+1)th row and (N+2)th column are same, shapes and positions of two blue anodes 301B respectively connected with pixel drive circuits in the circuit unit of (M+1)th row and N-th column and the circuit unit of M-th row and (N+2)-th column are same, shapes and positions of two first green anodes 301G1 connected with pixel drive circuits in the circuit unit of M-th row and (N+1)th column and the circuit unit of (M+1)-th row and (N+3)th column are same, shapes and positions of two second green anodes 301G2 connected with pixel drive circuits in the circuit unit of (M+1)th row and (N+1)th column and the circuit unit of M-th row and (N+3)th column are same. In an exemplary embodiment, shapes and areas of the red anode 301R, the blue anode 301B, the first green anode 301G1, and the second green anode 301G2 in one pixel unit are all different.

In an exemplary embodiment, shapes and areas of anodes of four sub-pixels in one pixel unit may be same, alternatively be different, a position relationship between four sub-pixels of one pixel unit and four circuit units in one circuit unit group may be same or different, and shapes and positions of the red anode 301R, the blue anode 301B, the first green anode 301G1 and the second green anode 301G2 in different pixel units may be same or different, which is not limited in the present disclosure.

In an exemplary embodiment, the subsequent preparation process may include: first forming a pattern of a pixel define layer, wherein the pattern of the pixel define layer may include a red pixel opening exposing a red anode, a blue pixel opening exposing a blue anode, a first green opening exposing a first green anode, and a second green opening exposing a second green anode. Then, forming an organic light emitting layer by evaporation or inkjet printing process, wherein the organic light emitting layer is connected with an anode through a respective pixel opening, and forming a cathode on the organic light emitting layer, wherein the cathode is connected with the organic light emitting layer. An encapsulation layer is formed. The encapsulation layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is disposed between the first encapsulation layer and the third encapsulation layer so that it can be ensured that external water vapor cannot enter the light emitting structure layer.

In an exemplary implementation, the substrate may be a flexible substrate or a rigid substrate. The rigid substrate may be made of, but is not limited to, one or more of glass and quartz. The flexible substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible substrate may include a first flexible material layer, a first inorganic material layer, a semiconductor layer, a second flexible material layer and a second inorganic material layer which are stacked, wherein materials of the first flexible material layer and the second flexible material layer may be polyimide (PI), polyethylene terephthalate (PET) or a polymer soft film with surface treatment; materials of the first inorganic material layer and the second inorganic material layer may be silicon nitride (SiNx) or silicon oxide (SiOx), etc., for improving the water-resistance and oxygen-resistance of the substrate; and the material of the semiconductor layer may be amorphous silicon (a-si).

In an exemplary embodiment, the first conducting layer, the second conducting layer, the third conducting layer and the fourth conducting layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The sixth conductive layer may be made of a single-layer structure, such as indium tin oxide ITO or indium zinc oxide IZO, or may be made of a multi-layer composite structure, such as ITO/Ag/ITO, etc. The first insulating layer, the second insulating layer, the third insulating layer, the fourth insulating layer, the fifth insulating layer and the sixth insulating layer may be made of any one or more of Silicon Oxide (SiOx), Silicon Nitride (SiNx), and Silicon OxyNitride (SiON), and may be a single layer, a multi-layer, or a composite layer. The first insulating layer is referred to as a buffer layer for improving the water and oxygen resistance of the substrate, the second insulating layer and the third insulating layer are referred to as gate insulating (GI) layers, the fourth insulating layer is referred to as an interlayer insulating (ILD) layer, and the fifth insulating layer and the sixth insulating layer are referred to as a passivation (PVX) layer. The first planarization layer may be made of an organic material such as resin. The active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic matter technology.

As can be seen from the structure and preparation process of the display substrate described above, according to the present disclosure, the data fan-out line is disposed in the display region, so that the leading line of the bonding region is connected with the data signal line through the data fan-out line. Therefore, there is no need to dispose fan-shaped oblique lines in the lead region, a length of the lead region in the vertical direction is effectively reduced, and a width of the lower bezel is greatly reduced, so that widths of the upper bezel, the lower bezel, the left bezel and the right bezel of the display apparatus are similar and all below 1.0 mm, which increases a screen-to-body ratio and is beneficial to achieving bezel-less display. According to the present disclosure, the first data fan-out line is disposed between the first power supply line and the data signal line, so that the first data fan-out line avoids the first power supply line, thus effectively reducing a parasitic capacitance between the first data fan-out line and the first power supply line, and effectively reducing crosstalk. In the present disclosure, the second data fan-out line is disposed in a region where the initial signal connection line is located, and the orthographic projection of the second data fan-out line on the substrate is at least partially overlapped with the orthographic projection of the initial signal connection line on the substrate, thus effectively reducing an influence of the data fan-out line to a potential of the key node in the pixel drive circuit and improving the display effect. In the present disclosure, an initial signal connection line of which a body portion extends along the second direction is disposed, and the initial signal connection line is connected with the first initial signal line through a via, so that the initial signal connection line and the first initial signal line form a grid structure, which not only effectively reduces a resistance of the first initial signal line and a voltage drop of a first initial voltage, but also effectively improves an uniformity of the first initial voltage in the display substrate, effectively improves the display uniformity, and improves the display character and the display quality. The preparation process in the present disclosure may be compatible well with an existing preparation process, which is simple in process implementation, easy to implement, high in production efficiency and yield, and low in production cost.

In an exemplary implementation, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), which is not limited herein in the present disclosure.

The structure shown and mentioned above in the present disclosure and the preparation process thereof are merely an exemplary description. In an exemplary implementation, the corresponding structures may be altered and the patterning processes may be added or reduced according to actual needs. For example, the first data fan-out line and the second data fan-out line may be disposed in different film layers. For another example, the first power supply line and the data signal line may be disposed in different film layers, etc., which is not limited in the present disclosure.

The present disclosure further provides a preparation method for a display substrate, for preparing the display substrate according to the foregoing embodiments. In an exemplary embodiment, the preparation method may include:

forming a drive circuit layer disposed on a substrate; the drive circuit layer includes a plurality of circuit units, at least one circuit unit of the plurality of circuit units includes a pixel drive circuit, a first power supply line providing a power supply signal to the pixel drive circuit, a data signal line providing a data signal to the pixel drive circuit, and a data fan-out line connected with the data signal line; at least a portion of the first power supply line, the data signal line, and the data fan-out line extends along a second direction and is arranged at intervals along a first direction, at least a portion of the data fan-out line is disposed between the first power supply line and the data signal line, the first direction intersects with the second direction.

The present disclosure further provides a display apparatus which includes the aforementioned display substrate. The display apparatus may be any product or component with a display function, such as a mobile phone, a tablet computer, a television, a display, a notebook computer, a digital photo frame, or a navigator, and the embodiments of the present invention are not limited thereto.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and alterations in forms and details of implementation without departing from the spirit and scope of the present disclosure. However, the patent protection scope of the present invention should be subject to the scope defined by the appended claims.

The invention claimed is:

1. A display substrate, comprising a drive circuit layer disposed on a substrate, wherein the drive circuit layer comprises a plurality of circuit units, at least one circuit unit of the plurality of circuit units comprises a pixel drive circuit, a first power supply line providing a power supply signal to the pixel drive circuit, a data signal line providing a data signal to the pixel drive circuit, and a data fan-out line connected with the data signal line; at least a portion of the first power supply line, the data signal line, and the data fan-out line is arranged at intervals along a first direction, and is extended along a second direction, at least a portion of the data fan-out line is disposed between the first power supply line and the data signal line, the first direction is intersected with the second direction;
wherein an orthographic projection of a portion of the data fan-out line extending along the second direction on a plane of the display substrate is not overlapped with an orthographic projection of the first power supply line on the plane of the display substrate, the orthographic projection of the portion of the data fan-out line extending along the second direction on the plane of the display substrate is not overlapped with an orthographic projection of a body portion of the data signal line on the plane of the display substrate.

2. The display substrate according to claim 1, wherein the data fan-out line is connected with the data signal line through a via hole.

3. The display substrate according to claim 1, wherein the data fan-out line at least comprises a first data fan-out line extending along the second direction, and at least a portion of the first data fan-out line is disposed between the first power supply line and the data signal line.

4. The display substrate according to claim 1, wherein the at least one circuit unit further comprises an initial signal line providing an initial signal to the pixel drive circuit, the initial signal line comprises a first initial signal line of which a body portion extends along the first direction and an initial signal connection line of which a body portion extends along the second direction, the initial signal connection line is connected with the first initial signal line; an orthographic projection of at least one data fan-out line on a plane of the display substrate is at least partially overlapped with an orthographic projection of the initial signal connection line on the plane of the display substrate.

5. The display substrate according to claim 4, wherein the initial signal connection line is connected with the first initial signal line through a via hole.

6. The display substrate according to claim 4, wherein the data fan-out line at least comprises a second data fan-out line extending along the second direction, and an orthographic projection of the second data fan-out line on the plane of the display substrate is at least partially overlapped with the orthographic projection of the initial signal connection line on the plane of the display substrate.

7. The display substrate according to claim 6, wherein the data fan-out line at least comprises a third data fan-out line extending along the first direction, and the third data fan-out line is connected with the first data fan-out line or the second data fan-out line.

8. The display substrate according to claim 1, wherein the display substrate comprises a display region and a bonding region located at a side of the display region, the first power supply line, the data signal line and the data fan-out line are disposed in the display region, and the bonding region comprises at least one lead line; a first end of the data fan-out line is connected with the data signal line, and a second end of the data fan-out line is connected with the lead line.

9. The display substrate according to claim 1, wherein in a direction perpendicular to the display substrate, the drive circuit layer comprises a first conductive layer, a second conductive layer, a third conductive layer and a fourth conductive layer sequentially disposed on the substrate, and insulating layers are disposed between the first conductive layer and the second conductive layer, between the second conductive layer and the third conductive layer, and between the third conductive layer and the fourth conductive layer; the data signal line and the data fan-out line are disposed in different conductive layers.

10. The display substrate according to claim 9, wherein the first power supply line and the data signal line are disposed in the third conductive layer, and the data fan-out line is disposed in the fourth conductive layer.

11. The display substrate according to claim 9, wherein the drive circuit layer further comprises a first initial signal line of which a body portion is extended along the first direction and an initial signal connection line of which a body portion is extended along the second direction, the first initial signal line and the initial signal connection line are disposed in different conductive layers, and the initial signal connection line is connected with the first initial signal line through a via hole.

12. The display substrate according to claim 11, wherein the first initial signal line is disposed in the second conductive layer and the initial signal connection line is disposed in the third conductive layer.

13. The display substrate according to claim 11, wherein the initial signal connection line is connected with a first region of an active layer of a first transistor in the pixel drive circuit through a via hole.

14. The display substrate according to claim 11, wherein the initial signal connection line comprises a first line segment and a second line segment connected with each other, the first line segment is a straight line segment extending along the second direction, the second line segment is a zigzag line segment, and an orthographic projection of the first line segment on a plane of the display substrate is at least partially overlapped with an orthographic projection of the second data fan-out line on the plane of the display substrate.

15. A display device, comprising the display substrate according to claim 1.

16. A method for manufacturing a display substrate, comprising:
forming a drive circuit layer on a substrate, wherein the drive circuit layer comprises a plurality of circuit units, at least one circuit unit of the plurality of circuit units comprises a pixel drive circuit, a first power supply line providing a power supply signal to the pixel drive circuit, a data signal line providing a data signal to the pixel drive circuit, and a data fan-out line connected with the data signal line; wherein at least a portion of the first power supply line, the data signal line, and the data fan-out line is arranged at intervals along a first direction and is extended along a second direction, at least a portion of the data fan-out line is disposed between the first power supply line and the data signal line, and wherein the first direction is intersected with the second direction;
wherein an orthographic projection of a portion of the data fan-out line extending along the second direction on a plane of the display substrate is not overlapped with an orthographic projection of the first power supply line on the plane of the display substrate, the orthographic projection of the portion of the data fan-out line extending along the second direction on the plane of the display substrate is not overlapped with an orthographic projection of a body portion of the data signal line on the plane of the display substrate.

17. The display substrate according to claim 2, wherein the display substrate comprises a display region and a bonding region located at a side of the display region, the first power supply line, the data signal line and the data fan-out line are disposed in the display region, and the bonding region comprises at least one lead line; a first end of the data fan-out line is connected with the data signal line, and a second end of the data fan-out line is connected with the lead line.

18. The display substrate according to claim 3, wherein the display substrate comprises a display region and a bonding region located at a side of the display region, the first power supply line, the data signal line and the data fan-out line are disposed in the display region, and the bonding region comprises at least one lead line; a first end of the data fan-out line is connected with the data signal line, and a second end of the data fan-out line is connected with the lead line.

19. The display substrate according to claim 2, wherein in a direction perpendicular to the display substrate, the drive circuit layer comprises a first conductive layer, a second conductive layer, a third conductive layer and a fourth conductive layer sequentially disposed on the substrate, and insulating layers are disposed between the first conductive layer and the second conductive layer, between the second conductive layer and the third conductive layer, and between the third conductive layer and the fourth conductive layer; the data signal line and the data fan-out line are disposed in different conductive layers.

\* \* \* \* \*